US010256568B2

(12) United States Patent
Bdeir

(10) Patent No.: US 10,256,568 B2
(45) Date of Patent: Apr. 9, 2019

(54) MODULAR ELECTRONIC BUILDING SYSTEMS WITH MAGNETIC INTERCONNECTIONS AND METHODS OF USING THE SAME

(71) Applicant: littleBits Electronics Inc., New York, NY (US)

(72) Inventor: Aya Bdeir, New York, NY (US)

(73) Assignee: littleBits Electronics Inc., New York, NY (US)

( * ) Notice: Subject to any disclaimer, the term of this patent is extended or adjusted under 35 U.S.C. 154(b) by 0 days.

(21) Appl. No.: 15/822,636

(22) Filed: Nov. 27, 2017

(65) Prior Publication Data

US 2018/0212358 A1 Jul. 26, 2018

Related U.S. Application Data

(63) Continuation of application No. 15/228,707, filed on Aug. 4, 2016, now Pat. No. 9,831,599, which is a (Continued)

(51) Int. Cl.
*H05K 1/14* (2006.01)
*H05K 1/11* (2006.01)
(Continued)

(52) U.S. Cl.
CPC ......... *H01R 13/6205* (2013.01); *H01R 11/30* (2013.01)

(58) Field of Classification Search
CPC ............................ H01R 11/30; H01R 13/6205
(Continued)

(56) References Cited

U.S. PATENT DOCUMENTS 2,493,697 A 1/1950 Raczkowski
2,879,685 A 3/1959 Page
(Continued)

FOREIGN PATENT DOCUMENTS

CN 3087332 10/1998
CN 3168690 12/2000
(Continued)

OTHER PUBLICATIONS

Office Action for U.S. Appl. No. 13/975,923, dated Mar. 10, 2016, 24 pages.
(Continued)

*Primary Examiner* — Hung S Bui

(57) ABSTRACT

Electrical connectors, electrical modules, and systems are provided. In one aspect, an electrical connector includes a housing defining a side surface, an electrical conductor supported by the housing and including an engagement portion proximate the side surface of the housing. The engagement portion is adapted to engage another electrical conductor of another electrical connector. The connector also includes a magnet supported by the housing proximate the side surface of the housing, a projection extending from the side surface of the housing, and a receptacle defined in the side surface of the housing. In other aspects, an electrical module includes at least one of these electrical connectors. In further aspects, a system includes a plurality of these modules and the modules are selectively couplable together.

21 Claims, 16 Drawing Sheets

Related U.S. Application Data continuation of application No. 14/696,922, filed on Apr. 27, 2015, now Pat. No. 9,419,378, which is a continuation of application No. 13/593,891, filed on Aug. 24, 2012, now Pat. No. 9,019,718.

(60) Provisional application No. 61/527,860, filed on Aug. 26, 2011.

(51) Int. Cl.
*H01R 13/62* (2006.01)
*H01R 11/30* (2006.01)

(58) Field of Classification Search
USPC .......................................................... 361/792
See application file for complete search history.

(56) References Cited

U.S. PATENT DOCUMENTS 2,947,914 A 8/1960 Simons
3,005,282 A 10/1961 Christiansen
3,008,245 A 11/1961 Meuche
3,034,254 A 5/1962 Christiansen
3,205,407 A 9/1965 Thompson
3,553,438 A 1/1971 Blitz et al.
3,594,689 A 7/1971 Hopt et al.
3,603,025 A 9/1971 Heubl
3,640,018 A 2/1972 Light
3,659,219 A 4/1972 Rueff, Jr.
3,803,531 A 4/1974 Sorensen
3,862,512 A 1/1975 Vogel
3,863,931 A 2/1975 Forsyth et al.
3,877,028 A 4/1975 Thomas
3,970,805 A 7/1976 Thomas
4,021,252 A 5/1977 Banczak et al.
D244,632 S 6/1977 Christiansen
4,053,159 A 10/1977 Kulak
4,064,377 A 12/1977 Regan
4,158,921 A 6/1979 Stolpen
4,181,824 A 1/1980 Seidel
4,183,173 A 1/1980 Ogawa
4,211,456 A 7/1980 Sears
4,233,778 A 11/1980 Lemelson
4,284,123 A 8/1981 Plockinger et al.
4,285,563 A 8/1981 Crosier et al.
4,314,236 A 2/1982 Mayer et al.
4,323,243 A 4/1982 Hanson et al.
4,348,191 A 9/1982 Lipsitz et al.
D267,895 S 2/1983 Petrie
4,376,538 A 3/1983 Keenan
4,449,942 A 5/1984 Salit
4,456,321 A 6/1984 Jones et al.
4,496,149 A 1/1985 Schwartzberg
4,510,210 A 4/1985 Hunt
4,516,260 A 5/1985 Breedlove et al.
4,538,675 A 9/1985 Welsh
4,542,784 A 9/1985 Welsh
4,546,267 A 10/1985 Urfirer
4,547,027 A 10/1985 Scheibenreif
4,552,541 A 11/1985 Bolli
4,556,272 A 12/1985 Briones
4,556,393 A 12/1985 Bolli
4,578,649 A 3/1986 Shupe
4,606,732 A 8/1986 Lyman
4,712,184 A 12/1987 Haugerud
4,736,367 A 4/1988 Wroblewski et al.
4,743,202 A 5/1988 Bach
4,796,891 A 1/1989 Milner
4,820,233 A 4/1989 Weiner
4,838,794 A 6/1989 Coddington
4,840,602 A 6/1989 Rose
4,846,687 A 7/1989 White et al.
4,853,884 A 8/1989 Brown et al.
4,874,176 A 10/1989 Auerbach
4,878,848 A 11/1989 Ingalsbe
4,883,440 A 11/1989 Bolli
4,890,241 A 12/1989 Hoffman et al.
4,893,817 A 1/1990 Shilo
4,905,176 A 2/1990 Schulz
4,910,396 A 3/1990 Grove
4,936,780 A 6/1990 Cogliano
4,937,811 A 6/1990 Harris
4,964,833 A 10/1990 Suzuki
4,968,255 A 11/1990 Lee et al.
4,969,827 A 11/1990 Hahs, Jr.
4,978,317 A 12/1990 Pocrass
5,013,276 A 5/1991 Garfinkel
5,088,951 A 2/1992 Majurinen
5,090,701 A 2/1992 Chang
D324,551 S 3/1992 Skov
5,172,534 A 12/1992 Milner et al.
5,190,287 A 3/1993 Ishiyama
5,191,276 A 3/1993 Zainaleain
5,203,711 A 4/1993 Bogiel
5,205,758 A 4/1993 Comerci et al.
D335,508 S 5/1993 Skov
5,227,232 A 7/1993 Lim
5,236,375 A 8/1993 Kachlic
D339,613 S 9/1993 Pirnat
5,244,403 A 9/1993 Smith et al.
5,275,567 A 1/1994 Whitfield
5,281,154 A 1/1994 Comerci et al.
5,304,069 A 4/1994 Brunker et al.
5,319,241 A 6/1994 Lim
5,345,221 A 9/1994 Pons et al.
5,349,129 A 9/1994 Wisniewski et al.
D352,750 S 11/1994 Kushner et al.
5,371,355 A 12/1994 Wodecki
D354,318 S 1/1995 Ryaa et al.
5,380,951 A 1/1995 Comerci et al.
5,385,344 A 1/1995 Miller et al.
5,409,227 A 4/1995 Walker
5,423,684 A 6/1995 Ishikawa
5,445,552 A 8/1995 Hine
5,447,433 A 9/1995 Perry, Jr.
5,451,178 A 9/1995 Yorozu et al.
5,452,201 A 9/1995 Pieronek et al.
5,455,749 A 10/1995 Ferber
5,459,283 A 10/1995 Birdwell, Jr.
5,462,443 A 10/1995 Kurbjuhn et al.
5,463,486 A 10/1995 Stevens
5,467,102 A 11/1995 Kuno et al.
5,469,331 A 11/1995 Conway et al.
D365,756 S 1/1996 Rask et al.
5,512,710 A 4/1996 Schroeder
D370,035 S 5/1996 Olsen
D371,583 S 7/1996 Knudsen
5,547,399 A 8/1996 Naghi et al.
5,547,933 A 8/1996 Lin
5,558,542 A 9/1996 O'Sullivan et al.
D374,257 S 10/1996 Schmidt et al.
5,563,771 A 10/1996 Bethurum
5,574,312 A 11/1996 Bayerer et al.
5,580,283 A 12/1996 O'Sullivan et al.
5,596,233 A 1/1997 Leiber et al.
5,607,336 A 3/1997 Lebensfeld et al.
5,610,931 A 3/1997 Huang
D378,837 S 4/1997 Olsen et al.
5,645,463 A 7/1997 Olsen
5,648,892 A 7/1997 Wieloch et al.
5,651,685 A 7/1997 Brinkman et al.
5,658,155 A 8/1997 McFarlane et al.
5,661,470 A 8/1997 Karr
5,663,938 A 9/1997 Dang et al.
5,667,411 A 9/1997 O'Sullivan et al.
D385,926 S 11/1997 Nielsen
5,697,829 A 12/1997 Chainani et al.
5,703,761 A 12/1997 Heiss
D389,408 S 1/1998 Rask et al.
5,705,853 A 1/1998 Faller et al.
5,721,496 A 2/1998 Farnworth et al.
5,722,861 A 3/1998 Wetter
5,724,074 A 3/1998 Chainani et al.
5,739,050 A 4/1998 Farnworth

(56) References Cited

U.S. PATENT DOCUMENTS 5,742,169 A 4/1998 Akram et al.
5,742,486 A 4/1998 Yangkuai
5,746,638 A 5/1998 Shiraishi
5,747,940 A 5/1998 Openiano
5,766,077 A 6/1998 Hongo
5,779,515 A 7/1998 Chung
5,799,067 A 8/1998 Kikinis et al.
RE35,896 E 9/1998 Brunker et al.
5,812,397 A 9/1998 Pech et al.
5,838,161 A 11/1998 Akram et al.
5,841,360 A 11/1998 Binder
5,845,503 A 12/1998 Choi
5,848,503 A 12/1998 Toft et al.
5,850,581 A 12/1998 Roller
5,853,327 A 12/1998 Gilboa
5,872,354 A 2/1999 Hanson
5,901,263 A 5/1999 Gaio et al.
5,902,155 A 5/1999 Polgar et al.
5,921,864 A 7/1999 Walker et al.
5,947,787 A 9/1999 Cyrus et al.
5,949,010 A 9/1999 Hacker
5,956,046 A 9/1999 Kehlet et al.
5,966,526 A 10/1999 Yokoi
5,971,855 A 10/1999 Ng
5,984,756 A 11/1999 Krog
6,024,626 A 2/2000 Mendelsohn
6,030,270 A 2/2000 Krog
6,062,937 A 5/2000 Kikuchi
6,099,353 A 8/2000 Wu
6,102,766 A 8/2000 Leadbetter et al.
6,110,000 A 8/2000 Ting
6,132,281 A 10/2000 Klitsner et al.
6,147,552 A 11/2000 Sauer
6,165,068 A 12/2000 Sonoda et al.
6,168,494 B1 1/2001 Engel et al.
6,171,168 B1 1/2001 Jessop
6,190,174 B1 2/2001 Lam
6,206,745 B1 3/2001 Gabai et al.
6,213,871 B1 4/2001 Yokoi
6,222,665 B1 4/2001 Neuner et al.
6,227,931 B1 5/2001 Shackelford
6,227,966 B1 5/2001 Yokoi
6,233,502 B1 5/2001 Yim
6,236,796 B1 5/2001 Tamura et al.
6,237,914 B1 5/2001 Saltanov et al.
6,271,453 B1 8/2001 Hacker
6,280,278 B1 8/2001 Wells
6,290,565 B1 9/2001 Galyean, III et al.
6,297,785 B1 10/2001 Sommer et al.
6,306,039 B1 10/2001 Kaji et al.
6,380,844 B2 4/2002 Pelekis
6,422,941 B1 7/2002 Thorner et al.
6,425,581 B1 7/2002 Barrett
6,438,456 B1 8/2002 Feddema et al.
6,443,796 B1 9/2002 Shackelford
6,454,624 B1 9/2002 Duff et al.
6,469,901 B1 10/2002 Costner
6,477,444 B1 11/2002 Bennett, III et al.
6,477,593 B1 * 11/2002 Khosrowpour ..... G06F 13/4027
361/790
6,478,583 B1 11/2002 Standiford et al.
6,480,510 B1 11/2002 Binder
6,505,087 B1 1/2003 Lucas et al.
6,527,611 B2 3/2003 Cummings
6,535,907 B1 3/2003 Hachiya et al.
D473,849 S 4/2003 Yeh
6,540,606 B1 4/2003 Matsukata
6,540,614 B1 4/2003 Nishino et al.
6,560,511 B1 5/2003 Yokoo et al.
6,563,413 B1 5/2003 Ponweiser et al.
6,569,018 B2 5/2003 Jaffe
6,574,234 B1 6/2003 Myer et al.
6,575,802 B2 6/2003 Yim et al.
6,579,178 B1 6/2003 Walker et al.
6,585,553 B1 7/2003 Fetridge et al.
6,605,914 B2 8/2003 Yim et al.
6,611,537 B1 8/2003 Edens et al.
6,628,244 B1 9/2003 Hirosawa et al.
6,629,771 B2 10/2003 Chiu
6,634,920 B1 10/2003 Michaelsen
6,652,383 B1 11/2003 Sonoda et al.
6,679,751 B1 1/2004 Maxwell et al.
6,682,230 B1 1/2004 Demangone et al.
6,682,392 B2 1/2004 Chan
6,687,128 B2 2/2004 Tokuhara
6,692,001 B2 2/2004 Romano
6,692,310 B2 2/2004 Zaderej et al.
6,719,603 B2 4/2004 Chan
6,725,128 B2 4/2004 Hogg et al.
6,727,177 B1 4/2004 Catabay et al.
6,752,680 B1 6/2004 Hansen
6,761,609 B1 7/2004 Andersen
6,773,322 B2 8/2004 Gabai et al.
6,795,318 B2 9/2004 Haas et al.
6,796,808 B2 * 9/2004 Hosoe .................... H01R 9/226
361/826
6,805,605 B2 10/2004 Reining et al.
6,819,304 B2 11/2004 Branson
6,850,426 B2 2/2005 Kojori et al.
6,893,316 B2 5/2005 Maxwell et al.
6,902,461 B1 6/2005 Munch et al.
6,931,656 B1 8/2005 Eshelman et al.
6,939,192 B1 9/2005 Munch et al.
6,940,783 B2 9/2005 Fox et al.
6,952,196 B2 10/2005 Weil et al.
6,956,826 B1 10/2005 Binder
6,965,298 B2 11/2005 Feinberg
6,967,274 B2 11/2005 Hanington
6,970,145 B1 11/2005 Aoki
6,979,245 B1 12/2005 Goodwin
6,988,008 B2 1/2006 Hudson et al.
7,008,324 B1 3/2006 Johnson et al.
7,044,825 B2 5/2006 Glickman et al.
7,066,778 B2 6/2006 Kretzschmar
7,089,083 B2 8/2006 Yokoo et al.
7,089,333 B2 8/2006 Marinescu et al.
7,104,863 B2 9/2006 Mimlitch, III et al.
7,124,157 B2 10/2006 Ikake
7,144,255 B2 12/2006 Seymour
7,145,933 B1 12/2006 Szajnowski
7,170,468 B2 1/2007 Knopf
7,184,272 B1 * 2/2007 Harlacher .............. H01R 24/40
361/728
7,184,718 B2 2/2007 Newman et al.
7,196,676 B2 3/2007 Nakamura et al.
7,234,941 B2 6/2007 Shuler et al.
7,238,026 B2 7/2007 Brown et al.
7,242,369 B2 7/2007 Huang
7,273,377 B2 9/2007 Seymour
7,275,937 B2 10/2007 Ellison
7,297,045 B2 11/2007 Pierson et al.
7,311,526 B2 12/2007 Rohrbach et al.
7,316,567 B2 1/2008 Hsieh et al.
7,322,873 B2 1/2008 Rosen et al.
7,331,793 B2 2/2008 Hernandez et al.
7,333,328 B2 2/2008 Funawatari et al.
7,344,380 B2 3/2008 Neidlein et al.
7,347,760 B2 3/2008 Wood et al.
7,358,929 B2 4/2008 Mueller et al.
7,369,399 B2 5/2008 Richardson
7,370,974 B2 5/2008 Yamada et al.
7,371,177 B2 5/2008 Ellis et al.
7,414,186 B2 8/2008 Scarpa et al.
D576,208 S 9/2008 Quercetti
7,427,066 B1 9/2008 Goodwin
D585,096 S 1/2009 Lin
7,507,136 B2 3/2009 Patton
7,508,141 B2 3/2009 Wong
7,510,457 B2 3/2009 Hussa-Lietz
7,511,454 B1 3/2009 Legg
7,541,907 B2 6/2009 Wang et al.
7,555,409 B1 6/2009 Bhaskar et al.
7,555,658 B2 6/2009 Vahid et al.
7,556,563 B2 7/2009 Ellis et al.

(56) References Cited

U.S. PATENT DOCUMENTS

| | | | |
|---|---|---|---|
| 7,584,565 | B2 | 9/2009 | Zebersky |
| 7,585,216 | B2 | 9/2009 | Foster |
| 7,596,473 | B2 | 9/2009 | Hansen et al. |
| 7,611,357 | B2 | 11/2009 | Han et al. |
| 7,641,477 | B2 | 1/2010 | DiFonzo et al. |
| 7,645,143 | B2 | 1/2010 | Rohrbach et al. |
| 7,666,054 | B2 | 2/2010 | Glickman et al. |
| D614,250 | S | 4/2010 | Frederiksen |
| 7,695,338 | B2 | 4/2010 | Dooley et al. |
| 7,708,615 | B2 | 5/2010 | Munch |
| 7,794,272 | B1 | 9/2010 | Hiatt et al. |
| 7,811,150 | B2 | 10/2010 | Amireh et al. |
| 7,819,114 | B2 | 10/2010 | Augenbraun et al. |
| 7,828,556 | B2 | 11/2010 | Rodrigues |
| 7,846,002 | B1 | 12/2010 | Mikesell et al. |
| 7,893,845 | B2 | 2/2011 | Ritzau |
| D635,190 | S | 3/2011 | Merrill et al. |
| 7,909,697 | B2 | 3/2011 | Zheng |
| 7,942,717 | B2 | 5/2011 | Chou |
| 7,952,322 | B2 | 5/2011 | Partovi et al. |
| 7,988,561 | B1 | 8/2011 | Lenkarski et al. |
| 7,996,111 | B2 | 8/2011 | Cheng et al. |
| 8,016,636 | B2 | 9/2011 | Park |
| 8,038,532 | B2 | 10/2011 | Neervoort et al. |
| 8,047,889 | B2 | 11/2011 | Ishii |
| 8,052,299 | B2 | 11/2011 | Lin |
| 8,057,233 | B2 | 11/2011 | Owen |
| 8,061,713 | B2 | 11/2011 | Cook |
| 8,079,890 | B2 | 12/2011 | Seligman |
| 8,087,939 | B2 | 1/2012 | Rohrbach et al. |
| 8,091,892 | B2 | 1/2012 | Sternberg |
| D658,586 | S | 5/2012 | Lin |
| 8,221,182 | B2 | 7/2012 | Seymour et al. |
| 8,243,438 | B2 | 8/2012 | Wang et al. |
| 8,257,157 | B2 | 9/2012 | Polchin |
| 8,321,782 | B1 | 11/2012 | Broucek |
| 8,348,678 | B2 | 1/2013 | Hardisty et al. |
| 8,491,312 | B2 | 7/2013 | Rudisill et al. |
| 8,528,905 | B2 | 9/2013 | Bianco |
| 8,567,149 | B2 | 10/2013 | Kuzmin |
| 8,573,596 | B2 | 11/2013 | Gearty |
| 8,576,031 | B2 | 11/2013 | Lauder et al. |
| 8,602,833 | B2 | 12/2013 | Binder |
| 8,616,948 | B2 | 12/2013 | Sherin et al. |
| 8,690,631 | B2 | 4/2014 | Nag |
| 8,753,164 | B2 | 6/2014 | Hansen et al. |
| 8,932,123 | B2 | 1/2015 | Murayama et al. |
| 8,951,088 | B2 | 2/2015 | Binder |
| D732,475 | S | 6/2015 | Bdeir |
| D751,988 | S | 3/2016 | Bdeir |
| D752,519 | S | 3/2016 | Bdeir |
| 9,419,378 | B2 | 8/2016 | Bdeir |
| D773,992 | S | 12/2016 | Krantz et al. |
| 9,597,607 | B2 | 3/2017 | Bdeir |
| D811,339 | S | 2/2018 | Bdeir |
| 9,019,718 | C1 | 3/2018 | Bdeir |
| 2002/0058235 | A1 | 5/2002 | Dinnerstein |
| 2002/0061701 | A1 | 5/2002 | Chan |
| 2002/0107075 | A1 | 8/2002 | Stephan |
| 2002/0111203 | A1 | 8/2002 | Chi |
| 2002/0155783 | A1 | 10/2002 | Chan |
| 2002/0186302 | A1 | 12/2002 | Pulkinnen |
| 2002/0196250 | A1 | 12/2002 | Anderson et al. |
| 2003/0021455 | A1 | 1/2003 | Dixon et al. |
| 2003/0148249 | A1 | 8/2003 | Marcus et al. |
| 2003/0162160 | A1 | 8/2003 | Horchler et al. |
| 2005/0003885 | A1 | 1/2005 | Rhoten |
| 2005/0049023 | A1 | 3/2005 | Foster |
| 2005/0075035 | A1 | 4/2005 | Hatting et al. |
| 2005/0184459 | A1 | 8/2005 | Marantz et al. |
| 2005/0234592 | A1 | 10/2005 | McGee et al. |
| 2005/0243489 | A1 | 11/2005 | Seymour |
| 2005/0245103 | A1 | 11/2005 | Ellison |
| 2006/0041730 | A1 | 2/2006 | Larson |
| 2006/0100739 | A1 | 5/2006 | Raffle et al. |
| 2006/0136180 | A1 | 6/2006 | Hansen et al. |
| 2007/0072442 | A1 | 3/2007 | DiFonzo et al. |
| 2007/0173095 | A1 | 7/2007 | Bin-Nun et al. |
| 2007/0184722 | A1 | 8/2007 | Doherty |
| 2007/0256337 | A1 | 11/2007 | Segan |
| 2007/0262984 | A1 | 11/2007 | Pruss |
| 2007/0278740 | A1 | 12/2007 | Mao |
| 2008/0083149 | A1 | 4/2008 | Zebersky |
| 2008/0166926 | A1 | 7/2008 | Seymour et al. |
| 2008/0224396 | A1 | 9/2008 | Cocis et al. |
| 2008/0232061 | A1 | 9/2008 | Wang et al. |
| 2008/0259551 | A1 | 10/2008 | Gavenda et al. |
| 2009/0034169 | A1 | 2/2009 | Richardson et al. |
| 2009/0127785 | A1 | 5/2009 | Kishon |
| 2009/0189348 | A1 | 7/2009 | Kucharski |
| 2009/0214051 | A1 | 8/2009 | Lockett et al. |
| 2009/0297136 | A1 | 12/2009 | Lin |
| 2009/0305602 | A1 | 12/2009 | Gaute |
| 2010/0033127 | A1 | 2/2010 | Griffin, Jr. et al. |
| 2010/0087119 | A1 | 4/2010 | Vicentelli |
| 2010/0151738 | A1 | 6/2010 | Chou |
| 2010/0197148 | A1 | 8/2010 | Rudisill et al. |
| 2010/0214747 | A1 | 8/2010 | Jacobs et al. |
| 2010/0259001 | A1 | 10/2010 | Muller et al. |
| 2010/0311300 | A1 | 12/2010 | Hansen et al. |
| 2010/0330867 | A1 | 12/2010 | Fogel et al. |
| 2011/0021107 | A1 | 1/2011 | Nag |
| 2011/0031689 | A1 | 2/2011 | Binder |
| 2011/0059652 | A1 | 3/2011 | Hoyack et al. |
| 2011/0097996 | A1 | 4/2011 | Kalanithi et al. |
| 2011/0127718 | A1 | 6/2011 | Wescom et al. |
| 2011/0143629 | A1 | 6/2011 | Seymour et al. |
| 2011/0151743 | A1 | 6/2011 | Munch et al. |
| 2011/0215998 | A1 | 9/2011 | Fitzgerald et al. |
| 2011/0217898 | A1 | 9/2011 | Barber |
| 2011/0221129 | A1 | 9/2011 | Sisson et al. |
| 2011/0256740 | A1 | 10/2011 | Naito et al. |
| 2011/0263145 | A1 | 10/2011 | Kim |
| 2011/0292618 | A1 | 12/2011 | Naukkarinen et al. |
| 2011/0300772 | A1 | 12/2011 | Risvig |
| 2012/0069502 | A1 | 3/2012 | Lauder et al. |
| 2012/0122059 | A1 | 5/2012 | Schweikardt et al. |
| 2012/0135613 | A1 | 5/2012 | Chatterjee et al. |
| 2012/0169748 | A1 | 7/2012 | Merrill et al. |
| 2012/0200034 | A1 | 8/2012 | Braha et al. |
| 2012/0223479 | A1 | 9/2012 | Pabon |
| 2012/0262301 | A1 | 10/2012 | Davidson et al. |
| 2012/0270479 | A1 | 10/2012 | Batty |
| 2013/0016483 | A1 | 1/2013 | Chuang et al. |
| 2013/0050958 | A1 | 2/2013 | Bdeir |
| 2013/0069305 | A1 | 3/2013 | Lee et al. |
| 2013/0079080 | A1 | 3/2013 | Binder |
| 2013/0234390 | A1 | 9/2013 | Pabon |
| 2013/0301224 | A1 | 11/2013 | Chu |
| 2013/0343025 | A1 | 12/2013 | Bdeir |
| 2014/0038466 | A1 | 2/2014 | Karodi et al. |
| 2015/0137448 | A1 | 5/2015 | Binder |
| 2015/0236444 | A1 | 8/2015 | Bdeir |
| 2016/0344136 | A1 | 11/2016 | Bdeir |
| 2017/0196086 | A1 | 7/2017 | Bdeir |

FOREIGN PATENT DOCUMENTS

| | | | |
|---|---|---|---|
| CN | 3237906 | | 5/2002 |
| CN | 2615787 | Y | 5/2004 |
| CN | 101076386 | | 11/2007 |
| CN | 101522274 | A | 9/2009 |
| CN | 301097689 | | 12/2009 |
| CN | 301216015 | S | 5/2010 |
| CN | 101843980 | A | 9/2010 |
| CN | 102025050 | | 4/2011 |
| CN | 301545488 | S | 5/2011 |
| CN | 301742222 | S | 11/2011 |
| CN | 102366677 | A | 3/2012 |
| CN | 102371073 | A | 3/2012 |
| CN | 102527060 | A | 7/2012 |
| CN | 102544814 | A | 7/2012 |
| EP | 0135633 | B1 | 12/1986 |
| EP | 0976430 | A1 | 2/2000 |

(56) References Cited

FOREIGN PATENT DOCUMENTS

| | | | |
|---|---|---|---|
| EP | 1180701 | A1 | 2/2002 |
| EP | 1616607 | A1 | 1/2006 |
| EP | 2163998 | A1 | 3/2010 |
| FR | 2629731 | A1 | 4/1988 |
| FR | 2709427 | A1 | 3/1995 |
| GB | 1378207 | | 12/1974 |
| GB | 2188956 | | 10/1987 |
| GB | 2267041 | | 11/1993 |
| GB | 2360469 | | 9/2001 |
| GB | 2398257 | | 8/2004 |
| GB | 2465339 | | 5/2010 |
| JP | S49-044613 | B | 11/1974 |
| JP | S62-060065 | U | 4/1987 |
| JP | S62-129781 | U | 8/1987 |
| JP | H02-216777 | A | 8/1990 |
| JP | 2002-537081 | T | 11/2002 |
| JP | 2007-507724 | T | 3/2007 |
| JP | 2008-516705 | T | 5/2008 |
| JP | 2009-165593 | A | 7/2009 |
| JP | 2011-014365 | A | 1/2011 |
| JP | 2011-054341 | A | 3/2011 |
| JP | D2010-24187 | | 5/2011 |
| JP | 3173981 | U | 3/2012 |
| KR | 20110129651 | A | 12/2011 |
| KR | 30-2003-0036843 | | 12/2014 |
| TW | 201226032 | A | 7/2012 |
| WO | WO 94/28348 | | 12/1994 |
| WO | WO 97/12349 | | 4/1997 |
| WO | WO 01/91867 | | 12/2001 |
| WO | WO 01/97937 | | 12/2001 |
| WO | WO 2003/032698 | | 4/2003 |
| WO | WO 2006/042549 | | 4/2006 |
| WO | WO 2007/137577 | | 12/2007 |
| WO | WO 2011/007349 | | 1/2011 |
| WO | WO 2011/011084 | | 1/2011 |
| WO | WO 2011/016032 | | 2/2011 |
| WO | WO 2011/122396 | | 10/2011 |
| WO | WO 2012/023935 | | 2/2012 |
| WO | WO 2013/175269 | | 11/2013 |
| WO | WO 2014/032043 | | 2/2014 |

OTHER PUBLICATIONS

Office Action for U.S. Appl. No. 13/593,891, dated Oct. 20, 2014, 9 pages.
Office Action for Chinese Application No. 201380004224.3, dated Jun. 2, 2015, 14 pages.
Office Action for Chinese Application No. 201380004224.3, dated Jan. 20, 2016, 12 pages.
Search Report for European Application No. 13831481.0, dated Feb. 22, 2016, 9 pages.
Office Action for European Application No. 13831481.0, dated Apr. 10, 2017, 4 pages.
Office Action for Japanese Application No. 2015-528712, dated Jun. 16, 2017, 20 pages.
Examination Report for New Zealand Application No. 704976, dated Jan. 9, 2017, 5 pages.
Supplementary Examination Written Opinion for Singapore Application No. 11201501308P, dated May 18, 2017, 4 pages.
Office Action for U.S. Appl. No. 14/696,922, dated Jun. 29, 2015, 12 pages.
International Search Report and Written Opinion for International Application No. PCT/US2013/056599, dated Jan. 16, 2014, 12 pages.
Request for Ex Parte Reexamination of U.S. Pat. No. 9,019,718, Control No. 90/013,673, filed Jan. 6, 2016, 45 pages.
Decision Granting Ex Parte Reexamination for Control No. 90/013,673, dated Jan. 28, 2016, 15 pages.
Office Action for Ex Parte Reexamination Application No. 90/013,673 of U.S. Pat. No. 9,019,718, dated Apr. 15, 2016, 19 pages.
Final Office Action for Ex Parte Reexamination Application No. 90/013,673 of U.S. Pat. No. 9,019,718, dated Jul. 20, 2017, 25 pages.
Office Action for U.S. Appl. No. 15/228,707, dated Apr. 24, 2017, 9 pages.
Office Action for U.S. Appl. No. 12/568,834, dated Aug. 7, 2012, 26 pages.
Office Action for U.S. Appl. No. 12/568,834, dated Mar. 13, 2013, 37 pages.
International Search Report and Written Opinion for International Application No. PCT\IL2010\000627, dated Feb. 24, 2011, 16 pages.
Office Action for U.S. Appl. No. 13/668,693, dated Apr. 2, 2014, 20 pages.
Office Action for U.S. Appl. No. 14/607,439, dated Oct. 5, 2016, 16 pages.
Final Office Action for U.S. Appl. No. 14/607,439, dated May 10, 2017, 18 pages.
Examination Report No. 1 for Australian Application No. 20133055556, dated Aug. 25, 2017, 4 pages.
International Search Report and Written Opinion for International Application No. PCT/IL2010/000559, dated Nov. 16, 2010, 12 pages.
Office Action issued by the Mexican Patent Office for Application No. MX/a/2015/002306, dated Oct. 11, 2017, 5 pages Non-English and 5 pages English translation.
Office Action issued by the New Zealand Intellectual Property Office for Application No. 704976, dated Oct. 27, 2017, 5 pages.
B&B Electronics, RS-422 and RS-485 Application Note, B&B Electronics Manufacturing Co., Ottawa, IL, USA, Revised Jun. 2006, 22 pages.
Bdeir, A., "Electronics as Material: littleBits," Proceedings of the 3rd International Conference on Tangible and Embedded Interaction, Florence, Italy (CHI 2008), (Apr. 5-10, 2008), 4 pages.
Bdeir, A. et al., "Electronics as Material: littleBits," Proceedings of the 5th International Conference on Tangible and Embedded Interaction, Funchal, Portugal (TEI '11), (Jan. 22-26, 2011), 4 pages.
Bdeir, A., "littleBits," Jul. 31, 2008, [online], Retrieved from the Internet: <URL: https://web.archive.org/web/20090512175818/http:/www.ayahbdeir.com/category/work/>, [Retrieved on Dec. 29, 2015], 10 pages.
Bdeir, A., "littleBits intro," [online], Retrieved from the Internet: <URL: https://vimeo.com/1384026>, [Retrieved on Dec. 28, 2015], printed copy of 3 pages from webpage and printed version of online video, 118 pages.
Bdeir, A., "What is littleBits?", 2008, [online], Retrieved from the Internet: <URL: https://videoandnewmedia.wordpress.com/2013/04/30/ayah-bdeir-littlebits-2008/>, [Retrieved on Dec. 29, 2015], printed copy of 2 pages from webpage and printed version of online video 132 pages.
Bdeir, A., "littleBits coffeemaker", Aug. 13, 2008, [online], Retrieved from the Internet: URL: http://www.core77.com/posts/10795/Video-Ultrafast-prototyping-using-littleBits>, [Retrieved on Dec. 29, 2015], printed copy of 4 pages from webpage and printed version of online video, 105 pages.
Bdeir, A., "Building blocks that blink, beep and teach," TED Talk (online), Retrieved from the Internet: <URL: http://www.ted.com/talks/ayah_bdeir_building_blocks_that_blink_beep_and_teach>, on Jan. 6, 2016, printed copy of 5 pages from webpage including 2 pages of video transcript.
Bowin Electronic Company, Hong Kong, Datasheet UM3481, UM3481 Series, "UM3481A a Multi-Instrument Melody Generator," REV. 6-03, (2010), 4 pages.
Bowin Electronic Company, Hong Kong, Datasheet LS 1356 IC, LSI, "4 Digit Time with Colon Default," Version 1.2 (Oct. 24, 2003), 6 pages.
Cisco Systems, Inc., Publication No. 1-58705-001-3, "Internetworking Technologies Handbook", Chapter 7: Ethernet Technologies, pp. 7-1 to 7-38, (Jun. 1999), 38 pages.
Cisco Systems, Inc., Publication No. 1-58705-001-3, "Internetworking Technologies Handbook," Chapter 20: Wireless Technologies, pp. 20-1 to 20-42, (Jun. 1999), 42 pages.
Duff, D. G. et al., "Evolution of PolyBot: A Modular reconfigurable Robot," (2002), 7 pages.
Electronic Snap Kits™ Electronics 202 Instruction Manual, Catalog #28-287, REV-C, Revised 2008, 132 pages.

(56) References Cited

OTHER PUBLICATIONS

Electronic Snap Circuits® Deluxe Snap Rover®, Projects 1-63 Instruction Manual, Elenco Electronics, Inc., 2008, 48 pages.
Electronic Snap Circuits® RC Snap Rover®, Projects 1-23 Instruction Manual, Elenco Electronics, Inc., REV-B, Revised 2008, 24 pages.
Epson Corporation, Datasheet PF226-04 EPSON 7910 Series, "Multi-Melody IC," Seiko-Epson Corporation, Electronic Devices Marketing Division, (1998), 4 pages.
FDK, Catalog Datasheet, "True Random No. Generation IC RPG100 / RPG100B," FDK Corporation, Sep. 2005, 4 pages.
Gilpin, K. et al., "Miche: Modular Shape Formation by Self-Disassembly," The International Journal of Robotics Research, 27:3-4 (Mar. 2008), 7 pages.
Holtek Semiconductor Inc., Datasheet HT3834, "36 Melody Music Generator," Rev. 1.00, CMOS VLSI Integrated Circuit (IC), (Nov. 2, 2006), 16 pages.
HYNIX Semiconductor, Inc., HMS30C7202 Highly Integrated MPU (ARM based 32-bit Microprocessor) Datasheet version 1.3, (2002), pp. vi and 9, <www.datasheetarchive.com/250--sound+module-datasheet.html>.
IBM Corporation, International Technical Support Organization Redbook Document No. SG24-4756-00, "Local Area Network Concepts and Products: LAN Operation Systems and Management," 1st Edition (May 1996), 216 pages.
IEEE Std. 802.3at™-2009, "Part 3: Carrier Sense Multiple Access with Collision Detection (CSMA/CD) Access Method and Physical Layer Specifications, Amendment 3: Data Terminal Equipment (DTE) Power via Media Dependent Interface (MDI) Enhancements," (2009), 141 pages.
IEEE Std. 802.3af™-2003, "Part 3: Carrier Sense Multiple Access with Collision Detection (CSMA/CD) Access Method and Physical Layer Specifications, Amendment: Data Terminal Equipment (DTE) Power via Media Dependent Interface (MDI)," (2003), 133 pages.
Integrated Circuit Systems, Inc., Datasheet ICS9120-08 and ICS9120-09, "Frequency Generator for Multimedia Audio Synthesis," Integrated Circuit Systems, Inc., 9120-08 9120-09 Rev C 052297P, downloaded from the Internet in 2009, 8 pages.
Jantapremjit, P. et al., "Design of a Modular Self-Reconfigurable Robot," Proc. 2001 Australian Conference on Robotics and Automation, Sydney (Nov. 14-15, 2001), 6 pages.
"Little Bits' electric LEGOs get supercharged with new cash," The Verge, Aug. 20, 2012 (online), [Retrieved on Jun. 8, 2017], Retrieved from the Internet: <URL: https://web.archive.org/web/20120820112825/https://www.theverge.com/2012/7/18/3167296/littlebits-electrical-legos-funding.
"Little Bits' electric LEGOs get supercharged with new cash," The Verge, Jul. 18, 2012 (online), [Retrieved on Jul. 7, 2017], Retrieved from the Internet: <URL: https://web.archive.org/web/20120820112825/https://www.theverge.com/2012/7/18/3167296/littlebits-electrical-legos-funding.
Magnevation LLC, SpeakJet chip, "Natural Speech & Complex Sound Synthesizer," User's Manual Revision 1.0, Magnevation LLC, (Jul. 27, 2004), 17 pages.
Maxim, Datasheet MAX3080-MAX3089 "Fail-Safe, High-Speed (10Mbps), Slew-Rate-Limited RS-485/RS-422 Transceivers," Maxim Integrated Products, Inc., Sunnyvale, CA. USA, 19-1138; Rev 3; (Dec. 2005), 20 pages.
Maxim, Datasheet MAX202E-MAX213E, MAX232E-MAX241-E, "±15kV ESD-Protected, 5V RS-232 Transceivers," Maxim Integrated Products, Inc. Sunnyvale, CA, USA, 19-0175; Rev 7; (Jan. 2015), 25 pages.
Maxim, Datasheet MAX3030E-MAX3033E, "±15kV ESD-Protected, 3.3V Quad RS-422 Transmitters," Maxim Integrated Products, Inc., Sunnyvale, CA, USA, 19-2671; Rev 0; (Oct. 2002), 15 pages.
Maxim, Datasheet MAX3095-MAX3096, "±15kV ESD-Protected, 10Mbps, 3V/5V, Quad RS-422/RS-485 Receivers," Maxim Integrated Products, Inc., Sunnyvale, CA, USA, 19-0498; Rev 1; (Oct. 2000), 13 pages.
Maxim, Datasheet "General Purpose Timers," ICM7555/7556, Publication No. 19-0481, Rev. 2, Maxim Integrated Products (Nov. 1992), 8 pages.
Mendelson, G., White Paper, "All You Need to Know About Power Over Ethernet (PoE) and the IEEE 802.3af Standard," PowerDsine Ltd., 06-0002-082 (May 20, 2004), 24 pages.
National Semiconductor, Application Note 1031, "TIA/EIA-422-B Overview," National Semiconductor Corporation AN012598, (Jan. 2000), 7 pages.
National Semiconductor, Application Note 1057, "Ten Ways to Bulletproof RS-485 Interfaces," National Semiconductor Corporation AN012882, (Oct. 1996), 10 pages.
Oki Electric Industry Co., Ltd., Datasheet ML2215 FEDL2215-01, OKI Semiconductor, "Speech synthesizer plus Music LSI with On-Chip 3 Mbit Mask ROM," (May 2001), 26 pages.
OPTi, Data Book, "82C931 Plug and Play Integrated Audio Controller," OPTi Inc., Milpitas, CA, USA, Doc. 912-3000-035 Revision 2.1 (Aug. 1, 1997), 64 pages.
Philips, Application Note, Integrated Circuits, "AN170-NE555 and NE556 Applications," Philips Semiconductors, (Dec. 1988), 19 pages.
RadioShack Electronics 202 Snap-Kit [online from Jun. 7, 2010], Retrieved from the internet at https://web.archive.org/web/20061215105908/http://www.radioshack.com/family/index.jsp?categoryID=2032405&cp=2032062.2032398, 2 pages.
RadioShack Electronics 202 Snap-Kit [online from Dec. 15, 2006] Retrieved from the internet at https://web.archive.org/web/20070706062800/http://www.radioshack.com/family/index.jsp?categoryId=2032405&cp=2032062.2032398, 6 pages.
RadioShack Electronics 202 Snap-Kit [online from Jul. 6, 2007] Retrieved from the internet at https://web.archive.org/web/20080116182315/http://www.radioshack.com/product/index.jsp?productId=2102915&cp=2032062.2032398&parentPage=family, 5 pages.
RadioShack Electronics 202 Snap-Kit [online from Jan. 16, 2008] Retrieved from the internet at https://web.archive.org/web/20100607064759/http://www.radioshack.com/family/index.jsp?s-null&categoryId=2032398&pg=2&s=null, 3 pages.
Schweikardt, E. et al., "roBlocks: A Robotic Construction Kit for Mathematics and Science Education," ICMI '06, Nov. 2-4, Banff, Alberta, Canada (2006), 4 pages.
Schweikardt, E. et al., "A Brief Survey of Distributed Computational Toys," The First IEEE International Workshop on, IEEE, PI (Mar. 1, 2007), 8 pages.
Schweikardt, E. et al., "Learning about Complexity with Modular Robots," Second IEEE International Conference, Piscataway, NJ, USA, (Nov. 17, 2008), 8 pages.
Schweikardt, E. et al., "The Robot is the Program: Interacting with roBlocks," (2008), 2 pages.
Stoy, K. et al. (eds.), "Modular Robotics: The State of the Art," Proceedings of the IEEE 2010 International Conference on Robotics and Automation Workshop, (May 3, 2010), 121 pages.
Teccor Electronics, "SIDACtor Data Book and Design Guide," Irving, Texas, USA (2002), 213 pages.
Universal Serial Bus Specifications, Revision 1.0, NTGR-SERC 012327-012594, (Jan. 15, 1996), 268 pages.
Yamaha, YMF721 Catalog No. LSI-4MF721A20, "YMF721 OPL4-ML2 FM+Wavetable Synthesizer LSI," Yamaha Corporation, Shizuoka, Japan (Jul. 10, 1997), 41 pages.
Yim, M. et al., "Modular Self-Reconfigurable Robots," Encyclopedia of Complexity and Systems Science, pp. 19-32 (2009).
Office Action for U.S. Appl. No. 14/607,439, dated Dec. 15, 2017, 19 pages.
Office Action for Russian Application No. 2015110259/12(016148), dated Aug. 2, 2017 (12 pages non-English, 10 pages English translation, and 2 pages English translation of Search Report).
Office Action for Japanese Application No. 2015-528712, dated Apr. 16, 2018, 6 pages non-English and 7 pages English translation.
Office Action for Russian Application No. 2015110259/12(016148), dated Feb. 22, 2018 (6 pages non-English, 6 pages English translation).

(56) References Cited

OTHER PUBLICATIONS

First Office Action for Chinese Application No. 201610730917.6, dated Jun. 4, 2018, 3 pages non-English and 5 pages English translation.
First Office Action for Chinese Application No. 201610740452.2, dated Jun. 4, 2018, , 4 pages non-English and 6 page English translation.
First Office Action issued by the Chinese Patent Office for Application No. 201610738594.5, dated Jun. 26, 2018, 8 pages non-English and 11 pages English translation.
Second Office Action for Chinese Application No. 201610740452.2, dated Jan. 21, 2019 (rec'd Jan. 25, 2019), 6 pages (Non-English).
Second Office Action for Chinese Application No. 201610730917.6, dated Jan. 21, 2019 (rec'd Jan. 25, 2019), 6 pages (Non-English).
Yim et al., "Modular Self-Reconfigurable Robot System," IEEE Robotics & Automation Magazine, Mar. 2007, 10 pages.

* cited by examiner

MODULAR ELECTRONIC BUILDING SYSTEMS WITH MAGNETIC INTERCONNECTIONS AND METHODS OF USING THE SAME

CROSS-REFERENCE TO RELATED APPLICATIONS

This application is a continuation of U.S. patent application Ser. No. 15/228,707, entitled "Modular Electronic Building Systems with Magnetic Interconnections and Methods of Using the Same," filed Aug. 4, 2016, which is a continuation of U.S. patent application Ser. No. 14/696,922, (now U.S. Pat. No. 9,419,378) entitled "Modular Electronic Building Systems with Magnetic Interconnections and Methods of Using the Same," filed Apr. 27, 2015, which is a continuation of U.S. patent application Ser. No. 13/593,891, (now U.S. Pat. No. 9,019,718) entitled "Modular Electronic Building Systems with Magnetic Interconnections and Methods of Using the Same," filed Aug. 24, 2012, which claims priority to and the benefit of U.S. Provisional Patent Application No. 61/527,860, filed Aug. 26, 2011, each of the disclosures of which is incorporated herein by reference in its entirety.

FIELD OF THE INVENTION

The present invention relates to the field of electronics and, more particularly, to electronic building blocks and toy building sets.

BACKGROUND

Currently, people spend many hours a day with technological devices, but most don't know how they work, or how to make their own. For all the interactivity of these devices, people are bound to passive consumption. Furthermore, playing, creating, or integrating electronics into projects, toys and products is intimidating, time consuming, requires an expert skill set, as well as specialized hardware/software platforms. People are afraid to connect electronic objects the wrong way, or to electrocute themselves. This makes building objects with lights, sounds, buttons and other electronic components very difficult and prohibitive to kids, young students, designers, non-engineers, and others lacking necessary experience. But as advances in the miniaturization of technology increase, electronics need to become more accessible to non-experts in a cost effective manner.

It becomes therefore clear that there is an opportunity and need to create a simple, easy to use, accessible electronic building block platform that can still enable the creation of complex, interdependent systems. Such a platform would enhance learning, enable 21$^{st}$ century experimentation and promote innovation. Also, what is needed is a system that acts like an additional material in the creative process and allows children and adults to combine and incorporate the system or its parts with other traditional materials such as paper, cardboard and screws.

The following references provide background information and are hereby incorporated by reference in their entirety: Ayah Bdeir, (2009), Electronics as material: littleBits, In *Proceedings of the* 3*rd International Conference on Tangible and Embedded Interaction* (TEI '09), ACM, New York, N.Y., USA, 397-400, DOI=10.1145/1517664.1517743, at http://doi.acm.org/10.1145/1517664.1517743; and Ayah Bdeir and Ted Ullrich, (2010), Electronics as material: littleBits, In *Proceedings of the fifth international conference on Tangible, embedded, and embodied interaction* (TEI '11), ACM, New York, N.Y., USA, 341-344, DOI=10.1145/1935701.1935781, at http://doi.acm.org/10.1145/1935701.1935781.

SUMMARY

In some exemplary aspects, an electronic educational toy or building system is provided that teaches the logic of programming and circuit building without requiring expertise in either. The modular block building system consists of pre-assembled printed circuit boards (PCB) interconnected by small magnets. Each block performs one or more discrete functions (e.g., an LED, a pushbutton, a light sensor with a threshold, etc.), and the blocks can be combined to create larger circuits. Some blocks respond to external events such as mechanical forces, touch, proximity, radio frequency signals, environmental conditions, etc. Other blocks are pre-programmed such as synthesizers, oscillators, etc. Still other blocks simply pass current like wire blocks. Yet other blocks provide current such as power blocks/modules.

In some aspects, the system includes modules having many different manners of interaction between the modules. The interaction between modules, not the modules themselves, may form the building blocks of the creative platform. In previous electronic kits the electronic component may be at the center of the manipulation: resistors, capacitors, batteries, etc. By manipulating the modules in those kits, children learn how electricity flows, how to design a circuit, or how to identify components. This knowledge, however, is application specific and features only a single circuit. It has little or no bearing on how the touch sensitive wheel of an iPod™ works, for example, or how a nightlight works, or how a cell phone vibrates, or how a phone can detect rotation and automatically rotate images on the screen in response to that rotation, or how to make one's own objects that have that interactivity. While we are a society obsessed with increasingly complex electronic devices (such as, for example, DVD players, MP3 players, cell phones, smoke alarms), the current learning tools on the market only teach the very basics of electronics and electricity, such as allowing us to turn on a light or see current flow. There is a widening gap between what is taught to the average American and what is both used and consumed by that American. This is also why most electronic kits and toys are very short-lived in that the kits and toys are not relevant to user's day-to-day life. To date, there is no way for children or adults to be able to create their own interactive objects with custom-designed interactive behavior, without having to program or learn the many complexities involved with advanced electronics. With the present modular system, people will be able to program interactivity intuitively and in a tangible way.

The description and drawings herein are meant as an illustration of one or more exemplary embodiments of the invention, but should not be considered limiting or restrictive. As such, there are a number of manners of modification without departing from the spirit and scope of the invention. In the following text, the words block and module may be used interchangeably to signify the modular circuit boards.

The modules may be divided into categories corresponding to their function. Examples of categories include, but are not limited to: power modules, input modules, output modules, wire modules, etc. Power modules for instance take current from a battery, a wall wart, or other power source, and convert it into current feeding the other components of the system. In any working configuration of modules, there may be at least one power module. Input modules include, but are not limited to: buttons, switches, sensors, logic blocks, etc. Output modules include, but are not limited to: LEDs, displays, sound modules, etc. Wire modules do not perform a particular function, but act as wire extensions, configuration changers, and in some cases logic and state modules.

In one exemplary embodiment, standalone blocks are provided that may enable users, with little or no electronics or programming experience, to construct basic and complex sensor and interaction-based analog and digital circuits.

In another exemplary embodiment, the general electrical operation of the system is as follows. All modules may include a standard interface and communicate automatically when connected. Each module includes three electrical lines and such lines are interconnected between and throughout all modules. These lines include Power, Signal and Ground. At the power modules, Power and Signal lines are at 5 Volts, the system is low power, and the Power and Ground lines are shared among all the modules. In other exemplary embodiments, the power may be something other than 5 Volts such as, for example, 3V, 9V, 12V, 15V, alternating current (AC), etc. Input modules take the incoming control Signal line, and manipulate it according to the module's function, and output the modified Signal voltage. In the case of a pressure sensor connected to a power module, for instance, the sensor module takes 5 Volts into the Signal line, and outputs a voltage between 0 and 5 Volts depending on the amount of pressure applied to the sensor. Output modules respond to the Signal line by "visualizing" the voltage in light, sound, display or other forms.

All modules are pre-assembled, pre-engineered, and contain the logic and circuitry required to make the component readily usable. For instance, an LED module contains a resistor corresponding to its current rating, an Operation Amplifier (OpAmp) as a buffer from the remainder of the circuit, and a coin cell battery module incorporates a discharge protection circuit. In some exemplary embodiments, the system requires no prior knowledge of electronics and does not require any hardware or software platform. In other exemplary embodiments, the system may include a hardware and/or software platform. Also, in some exemplary embodiments, since the modules do not need to be programmed and do not require a central circuit controlling them, the system is standalone and does not need a computer or hub. However, according to one exemplary embodiment, the system may be connected to a device such as a computer, hub, memory storage, or personal electronic mobile device such as a cellular phone, smart phone, etc., in order to create additional functionality or to retrieve information or power from the device.

In some aspects, the modules are designed to couple together and cascade one after the next. The modules include magnetic connectors that ensure electrical connectivity and may be developed and mounted on the PCB. The magnetic connectors may be in male form and female form, and in some examples may correspond to north and south faces of magnets. For standard blocks, each block may have two magnetic connectors mounted on it, one with the north face of the magnet(s) facing out and the other with the south face of the magnet(s) facing out. The south facing side of the magnetic connector of one module connects to the north facing side of the magnetic connector on the next module. This ensures proper connection and appropriate polarity. The repelling polarities inhibit the magnets from connecting in an inappropriate manner to facilitate connecting of the modules in the correct manner.

In another exemplary embodiment, the magnetic connector includes two magnets and three conductors embedded in an injection molded plastic body. The two magnets act as polarizing and locking elements, whereas the conductors carry the signal from one circuit board to the next through the mating of the male and female connectors. In the male version of the connector, the three conductors are spring probes. On the female version of the connector, the conductors may either be spring probes or small metal plates. Either way, the spring probes or the metal plates come into contact with the spring probes of the male connector and transfer the electrical signals into the circuit board. The magnetic connector also features an interlocking system as part of the plastic casing in the form of male and female complementary components. In one example, a male protrusion is included on one block and a female indentation is included on a second block. The protrusion and indentation cooperate to inhibit the blocks from sliding with respect to each other. In another example, a male protrusion and a female indentation are included on each block and the male protrusions and the female indentations on interfacing blocks cooperate to inhibit the blocks from sliding with respect to each other.

According to one exemplary embodiment, the magnetic connector also features an interlocking system as part of the plastic casing in order to inhibit the modules from sliding side-to-side with respect to each other, and to ensure that the modules are assembled in the correct orientation (i.e., to inhibit an upside-down connection). To inhibit side-to-side movement, the connectors can include a protrusion on the male or female side that corresponds to an indentation on the corresponding female or male side. Once the modules are connected, the protrusion enters the indentation and the modules are sufficiently locked together such that side-to-side movement is inhibited. In another embodiment, the connectors can include a tabbed feature to inhibit side-to-side movement. For example, as shown in FIG. 12, the portion of the connector nearest the circuit board (the "base") includes both a rounded tab that protrudes laterally from the connector and a rounded indentation adjacent to the tab. A corresponding connector will include a rounded tab and indent in a configuration such that when the two connectors are adjoined, the rounded tab of the first connector inserts into the rounded protrusion of the second connector, and the rounded tab of the second connector inserts into the rounded protrusion of the first connector, thereby locking the two connectors together such that side-to-side movement is prevented. To prevent upside-down connections, the connectors can include one or more protrusions. For example, as shown in FIG. 12, the portion of the connector furthest from the circuit board (the "top") includes a series of horizontal protrusions. When two modules are adjoined by the user, the horizontal protrusions on the two modules will properly align. Further, due to the rounded tab at the bottom of the connector, as shown in FIG. 12 for example, if a second connector was adjoined upside-down, the horizontal protrusions of the second connector would hit the rounded tab of the first connector and prevent the two connectors from properly adjoining.

In addition to the previously described exemplary connectors, many modifications to the connectors are possible, including, but not limited to, the casing, the type of conductors used, the number of conductors, as well as whether or not the magnets are acting as conductors, the number of magnets, the shape of the magnets, the polarity of the magnets, the manner in which the connectors couple to the circuit board of the block, etc.

In order for the system to be expressive and broaden, rather than constrain creativity, the number of available modules needs to be plenty. In general, only having a few nuts and bolts in the prototyping process is not very helpful, and alternatively can even be prohibitive. The present invention allows for the addition of new modules according to the interconnection and voltage standards. For example, starting from a set of a hundred modules, we can imagine and design hundreds or thousands of additional modules that fit and cooperate with the present system to extend the system's functionality. For example, we can potentially build modules such as galvanic skin sensors, arsenic detectors, microcontroller modules, etc., as well as adapter boards to other electronic block building systems and interfaces.

At least one exemplary embodiment has been designed to allow for complex behaviors programmed through physical interaction. The set features logic and state modules that introduce the concept of programming to novices. Examples of such modules are the AND, OR and NOT blocks, as well as the Threshold block. These enable the user to program certain behaviors of his/her designed system without needing to learn a programming language, to write code on a computer, or to program a microcontroller circuit. Programming here is done through using logic modules to create decision trees. Also, modules feature controls such as switches, knobs and buttons that enable selection of modes of behavior. Just like a blender can have three buttons, each button corresponding to a particular speed of its motor, some modules in the present invention allow for the selection of a mode or adjustment of their behavior. For instance, a proximity sensor block can contain a mode switch and a potentiometer. Through the manipulation of the embedded potentiometer, the threshold level can be set, determining the input voltage level beyond which the module should output a high. Also, by flipping the switch, the module can go from normally-high to normally-low, in essence inverting its response to the desired threshold.

All blocks may be designed with space constraints in mind and may be kept at the minimum size possible in order to make the blocks easily integreable with other materials such as, for example, cardboard, plastic, pipe cleaners, etc. The blocks are user friendly in their look as well as their size, and make playing and prototyping with them attractive to children and adults alike regardless of the goal.

The modules may be offered as individual blocks or as sets. These can range from standard block components to specialized sets such as sensor sets, mechanical sets, biological sets, sound sets, etc. Also, users can design and build their own modules or sets to extend the library.

In some aspects, an electrical connector is provided and includes a housing defining a side surface, an electrical conductor supported by the housing and including an engagement portion proximate the side surface of the housing, wherein the engagement portion is adapted to engage another electrical conductor of another electrical connector, a magnet supported by the housing proximate the side surface of the housing, a projection extending from the side surface of the housing, and a receptacle defined in the side surface of the housing.

In other aspects, an electrical module is provided and includes a circuit board and an electrical connector. The electrical connector includes a housing defining a side surface, an electrical conductor supported by the housing and including a coupling portion and an engagement portion, wherein the coupling portion is adapted to engage and electrically communicate with the circuit board, and wherein the engagement portion is proximate the side surface of the housing, a magnet supported by the housing proximate the side surface of the housing, a projection extending from the side surface of the housing, and a receptacle defined in the side surface of the housing.

In further aspects, a system is provided and includes a plurality of electrical modules selectively couplable together to transmit electrical current from one electrical module to another electrical module, each module has at least one functionality associated therewith and includes an electrical connector adapted to couple to an electrical connector of another one of the electrical modules, wherein, with the electrical connectors coupled together, a functionality of at least one of the plurality of electrical modules is dependent upon at least another one of the plurality of electrical modules.

In still other aspects, a system is provided and includes a plurality of electrical modules adapted to be selectively coupled to one another, wherein the plurality of electrical modules include at least a first electrical module and a second electrical module, the first electrical module including a first circuit board, and a first electrical connector including a first housing, a first electrical conductor supported by the first housing and including a first coupling portion and a first engagement portion, wherein the first coupling portion is adapted to engage and electrically communicate with the first circuit board, a first magnet supported by the first housing, a first projection extending from the first housing, and a first receptacle defined in the first housing. The second electrical module includes a second circuit board, and a second electrical connector including a second housing, a second electrical conductor supported by the second housing and including a second coupling portion and a second engagement portion, wherein the second coupling portion is adapted to engage and electrically communicate with the second circuit board, a second magnet supported by the second housing, a second projection extending from the second housing, and a second receptacle defined in the second housing, wherein, with the first electrical module coupled to the second electrical module, the first magnet is magnetically coupled to the second magnet, the first engagement portion engages the second engagement portion, the first projection is at least partially positioned within the second receptacle, and the second projection is at least partially positioned within the first receptacle.

The present invention is capable of various modifications and alternative constructions, some of which are detailed in the drawings below. However, it should be clear that the intention is not to limit the invention to a particular embodiment or form, but rather the present invention should cover changes, additions and modifications as part of its scope. Independent features and independent advantages of the present invention will become apparent to those skilled in the art upon review of the detailed description and drawings.

Figure 1:
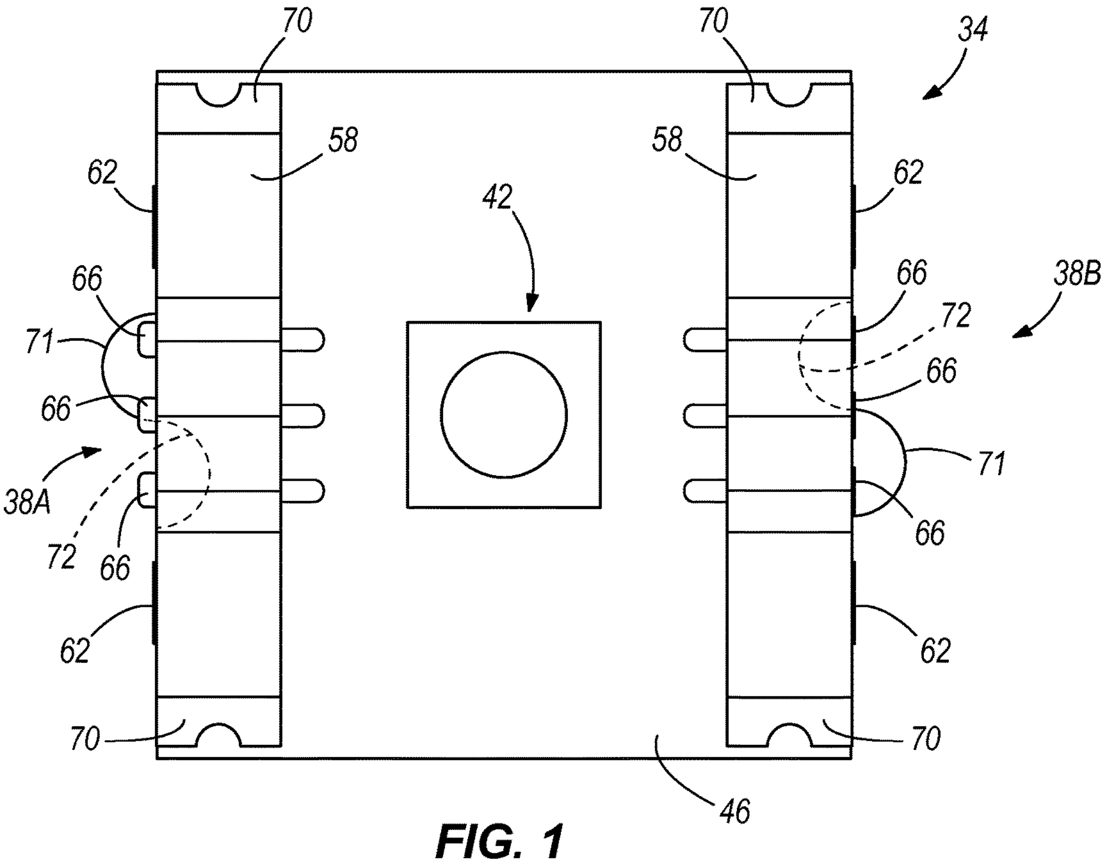
FIG. 1 is a top view of an exemplary module of the system.

Before any independent features and embodiments of the invention are explained in detail, it is to be understood that the invention is not limited in its application to the details of the construction and the arrangement of the components set forth in the following description or illustrated in the drawings. The invention is capable of other embodiments and of being practiced or of being carried out in various ways. Also, it is understood that the phraseology and terminology used herein is for the purpose of description and should not be regarded as limiting. For example, directional terms such as "top", "bottom", "above", "below", "front", "back", etc. are not intended to be limiting and are used for describing the exemplary illustrated embodiments herein.

DETAILED DESCRIPTION

An exemplary electronic building system 30 is provided. The electronic building system 30 is not only meant for use with pre-designed components and modules 34, but can also allow users to combine those modules 34 with other traditional prototyping and playing items in a design studio or home. Such materials may include, for example, paper, cardboard, wood, glue, pipe cleaners, foam, etc., thereby encouraging individuals to treat electronics like a material in the creative process.

In some exemplary embodiments, the system 30 may include at least four different types of modules 34: power; input; output; and wire; although more types of modules 34 are possible. Power modules 34 provide electricity to the system 30. Input modules 34 interpret data or their surroundings and provide that input to the system 30. Output modules 34 make visual, physical, or audible changes to their surroundings based on input(s) to the system 30. Wire modules 34 route power and communication between the modules 34 in the system 30.

According to one exemplary embodiment, when a first module 34 is connected to a second module 34, the power signal is transferred from the first module 34 to the second module 34. Accordingly, the second module 34 is powered entirely by the first module 34. If a button module 34, sensor module 34, or other module 34 is placed somewhere between a first module 34 and a second module 34, the current may be affected by the action of the button module 34 or sensor module 34. For example, current may not pass (or, alternatively, may continuously pass) from the first module 34 to the second module 34 unless the button on the button module 34 is depressed or the sensor on the sensor module 34 is activated. Similarly, if a sensor module 34 is only partially activated, then only partial current is transferred from the first module 34 to the second module 34.

Many different types of modules 34 are possible in each category, including but not limited to the following: (i) power modules: wall power modules, battery power modules, solar power modules, discharge protection circuits; (ii) input modules: pulse modules, pressure sensor modules, proximity modules, input recording modules, potentiometer modules, button modules, temperature modules, accelerometer modules, memory modules, timer modules; (iii) output modules: motion modules, vibration motor modules, fan modules, RGB LED modules, LED modules, bar graph modules, speaker modules; and (iv) wire modules: wire modules of various lengths, extender modules, splitter modules, and electroluminescent wire modules. Any known type of circuit or electronic component or combination of components may be used to create a module 34 and thus form a portion of a system 30 built using such components.

The modular system 30 described herein is reusable, scalable from small and simple circuits to large and complex circuits, and are sophisticated enough to allow for complex programming of behavior through manipulating tangible objects (using logic and state modules 34). Additionally, just as programmers use software modules and libraries to create bigger and more complex software programs, the modules 34 are transformed into a library of electronic components that can be used to create bigger and more complex components or systems. Indeed, a user can expand the module library almost indefinitely, adding any new component that they wish to use to their module repository.

Users can even create their own modules 34 and add them to the rest of the library. For example, according to one exemplary embodiment, users may be provided with components of a module 34—such as male magnetic connectors 38A and female magnetic connectors 38B that are able to snap onto or otherwise couple to a small circuit board, sensor, or other electronic component such that the connectors 38A/38B transmit current from one module 34 to another—that they can use to create their own inter-connectable modules 34 built from circuit board, sensors, or output mechanisms that they have built or gathered from another source.

According to another exemplary embodiment, a system 30 comprising several modules 34 may be commercialized as a single kit or set. The kit may include one or more different modules 34 (power, input, output, and/or wire), may comprise one or more different types of each module 34, a container in which to store the modules 34, a mounting board or substrate upon which to place or couple modules, may include learning materials, accessories, instructions, or a variety of other components. For example, a kit may comprise a handful of modules 34 that may be connected in an almost unlimited number of combinations to perform numerous different input and output functions (see FIGS. 10 and 17). In other exemplary embodiments, the kit may also comprise a limited number of modules 34 that are intended to be assembled in a limited number of combinations, including a single combination, to perform a limited number of functions. For example, to comprise a kit that is intended to be built into a functional system, the kit can comprise as many as tens or hundreds or more modules 34, or it can comprise just two modules 34 (a power module and an output module). Alternatively, the kit may be intended to augment an existing module library, in which case it may comprise just one type of module 34, such as a kit of only wire modules 34 or only output modules 34, for example. The kits may also be directed to a certain age group, with a kit for the elementary level comprising fewer and/or less complicated modules 34 than a kit designed for the high school level, for example. In one exemplary embodiment, the kits may include instructions, videos, or other means which inform the user as to one or more possible combinations of the modules 34. For example, the instructions may instruct the user how to assemble the modules 34 into a battery-powered motion sensor that emits an audible alarm upon detection of movement.

One potential aspect of the exemplary kits, systems, and modules may be to extend the concept of the modular platform into more complex components. According to one exemplary embodiment, the system 30 is adapted to give access to sophisticated devices through, for example, simple three-line analog interfaces. Exemplary complex devices may include, but are not limited to, LCD displays, OLED screens, timers, accelerometers, logic gates, and many more. This may be accomplished by pre-engineering all modules 34 and providing "entry points" into the devices. The entry points are, for example, knobs or switches that allow the user to adjust the intensity or frequency of pulsing, flip modes of operation, set thresholds, make decisions, or remember a configuration, among many other operations. These may be considered "entry points" because they are based on similar devices that people know how to use from their everyday lives. The exemplary modular systems described herein may take lessons and iconography from consumer electronics (such as, for example, blenders, DVD players, alarm clocks, game consoles) and apply them to these semi-raw electronic modules 34. In this way, the modular system 30 may treat electronic components like they are electronic devices. This means the learning curve for using and creating with the modular system 30 is very low, and the user's pre-existing knowledge obtained from manipulating their own consumer electronics may be taken advantage of to allow the users to program new objects through interaction.

An exemplary entry point may include an OLED screen module 34 which requires an SD card slot in which users can insert an SD card preloaded with images and video. The OLED screen module 34 may also include a microcontroller on-board which is pre-programmed with firmware to access and display the images. Also integrated in the OLED screen module 34 may be a toggle switch and a knob, where the toggle switch selects between fixed images/video or looping and the knob adjusts the looping speed. In the above example, even though the circuit-board and firmware itself may be complex, the end result will be an easy-to-use OLED screen module 34 with appropriate iconography that may be accessible to children and novice users alike. The exemplary system 30 may allow for and include the pre-engineering and design of numerous other complex modules 34 similar to the OLED screen example.

Figure 2:
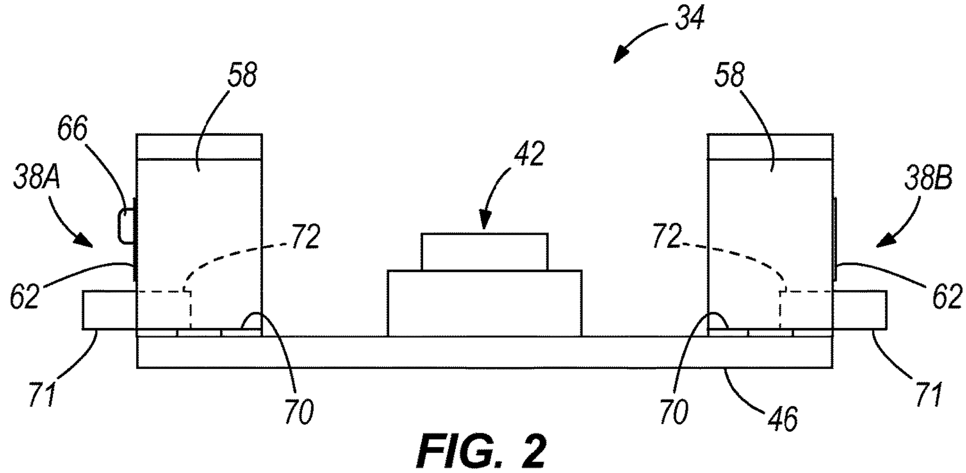
FIG. 2 is a side view of the module shown in FIG. 1.

Referring now to FIGS. 1 and 2, an exemplary module or block 34 of the electronic building system 30 is illustrated (exemplary systems 30 illustrated in FIGS. 3, 4, 7, 9, and 10). The illustrated block 34 is a tact switch module 34 or a pushbutton, and illustrates how discrete electronic components are turned into blocks 34. A pushbutton component 42 is coupled (e.g., soldered) onto a Printed Circuit Board 46 that has two interfaces, the input interface and the output interface. A magnetic connector is mounted at each of the two interfaces. In some exemplary embodiments, the magnetic connectors may be the same type of connector. In other exemplary embodiments, the connectors may include a male connector 38A on the input interface side and a female connector 38B on the output interface side.

The input interface of the tact switch module 34 in FIG. 1 is designed to couple with the output interface of a previous module 34, and the output interface of the illustrated module 34 is designed to couple with the input interface of the next module 34. The module 34 features electrical traces designed to complete connections between two engaging interfaces for a Power line and a Ground line. A Signal line goes through the button 42, which makes or breaks the circuit, and thus transfers a modified Signal line to the output interface corresponding to the module function. In the illustrated exemplary embodiment, the magnetic connectors 38A/B are coupled (e.g., soldered) to the PCB 46 by way of surface mount pads. The above-described drawing also illustrates the modular design of the system 30, as well as the connection and communication standards that make the system 30.

Figure 3:
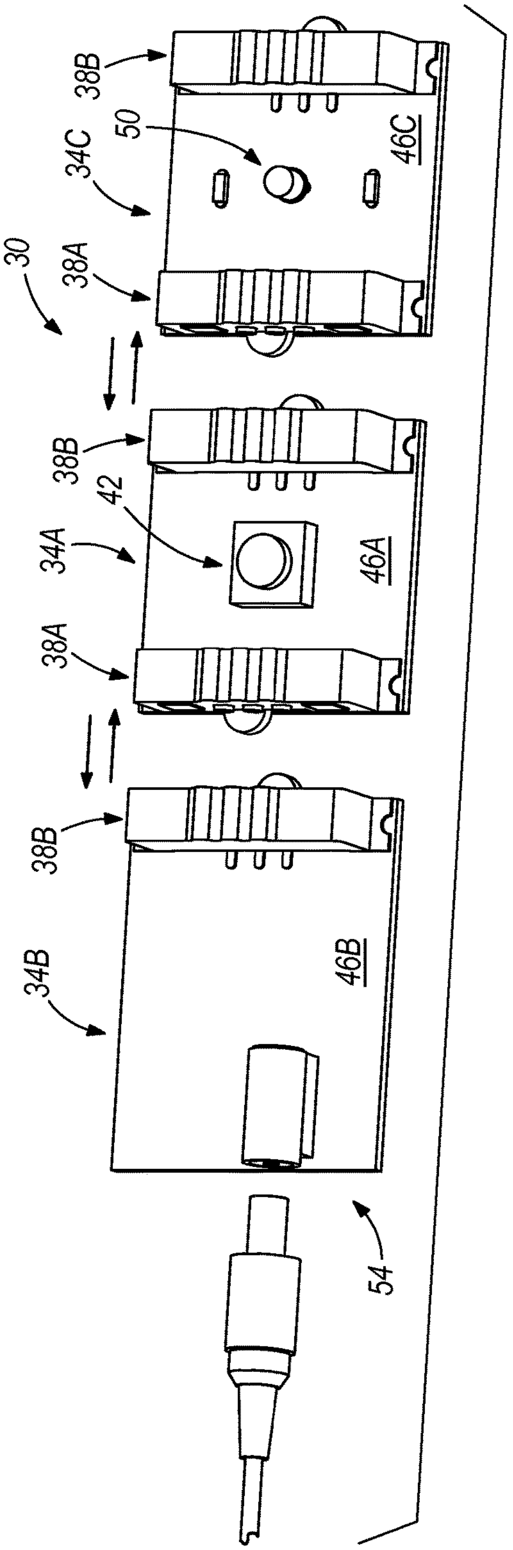
FIG. 3 is a top view of a set of three modules before connecting the three modules.
Figure 4:
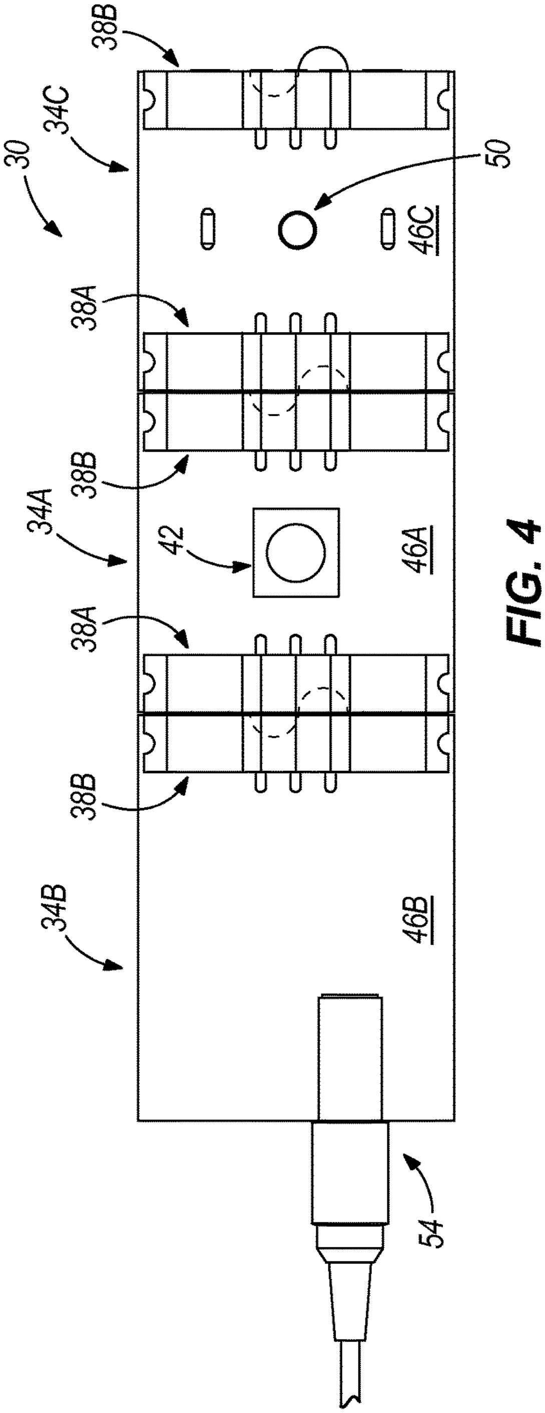
FIG. 4 is a top view of the three modules shown in FIG. 3 after connection to illustrate how the modules connect together using magnetic connectors of the modules.

An exemplary configuration of an electronic building system 30 is illustrated in FIGS. 3 and 4 and includes the exemplary tact switch module shown in FIGS. 1 and 2. In these figures and the figures hereafter, different modules will be identified with a common reference number "34" and a letter (e.g., 34C, 34D, 34E, etc.) associated with each different module. Likewise, similar components between the modules will be identified with similar reference numbers and a letter corresponding to the letter associated with the module (e.g., module 34F, connector 38F, circuit board 46F, etc.).

In FIGS. 3 and 4, an exemplary tack switch module 34A is shown in the middle between a wall power module 34B and a Light Emitting Diode (LED) module 34C. The male connector 38A on the tact switch module 34A is attracted to the female connector 38B on the wall power module 34B via the magnetic connectors described in detail below. The same manner of coupling applies to the tact switch module 34A and the LED module 34C, which contains a dip package LED component 50 coupled (e.g., soldered) to the PCB 46C. When the magnetic connectors in the three illustrated modules 34 couple together as in FIG. 4, and the user pushes down the tact switch 42 of the switch module 34A, the circuit is completed and the LED 50 illuminates. The power module 34B has a power adapter connector 54 that delivers DC voltage to the power module 34B. The pre-integrated circuitry in the power module 34B then drops down the voltage to a required voltage such as, for example, 5 Volts in the present example. Note that if the tact switch module 34A is removed from between the two other modules, the LED module 34C will be attracted to the power module 34B and LED 50 will remain illuminated at all times. In the above mentioned scenario, there is one power block (the wall power), one input block (the switch) and one output block (the LED). It should be understood that the exemplary blocks 34 may be replaced by other blocks 34 having other functionality. For example, the LED block 34C may be replaced by a buzzer block and, when the button is pressed, the buzzer makes an audible sound. Hundreds of other combinations are possible with different blocks having different functionality all forming different circuits, with immediate response of the elements, and without any need for programming, soldering or circuit assembly.

Figure 5:
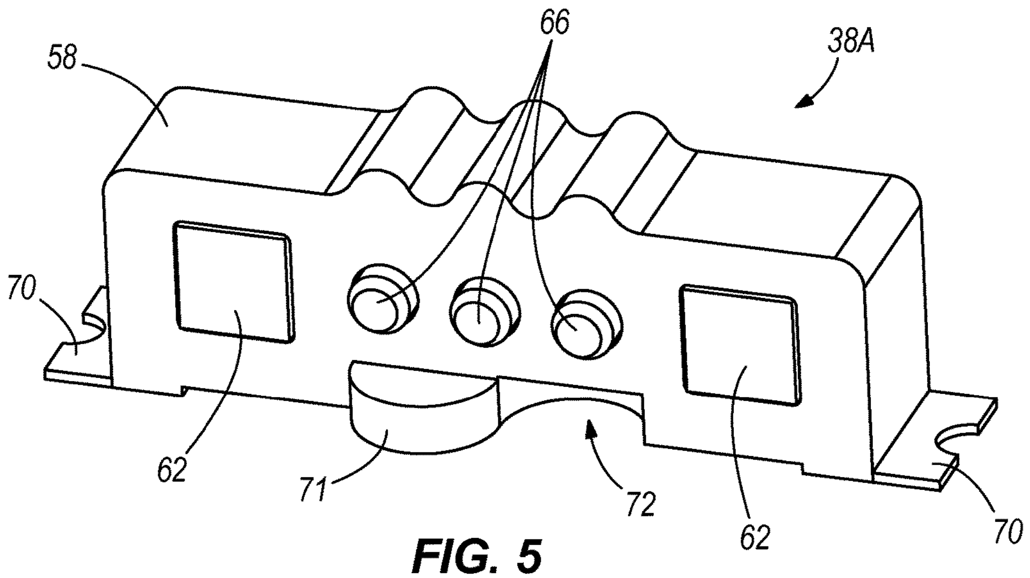
FIG. 5 is a perspective view of an exemplary embodiment of a magnetic connector of a module.
Figure 6:
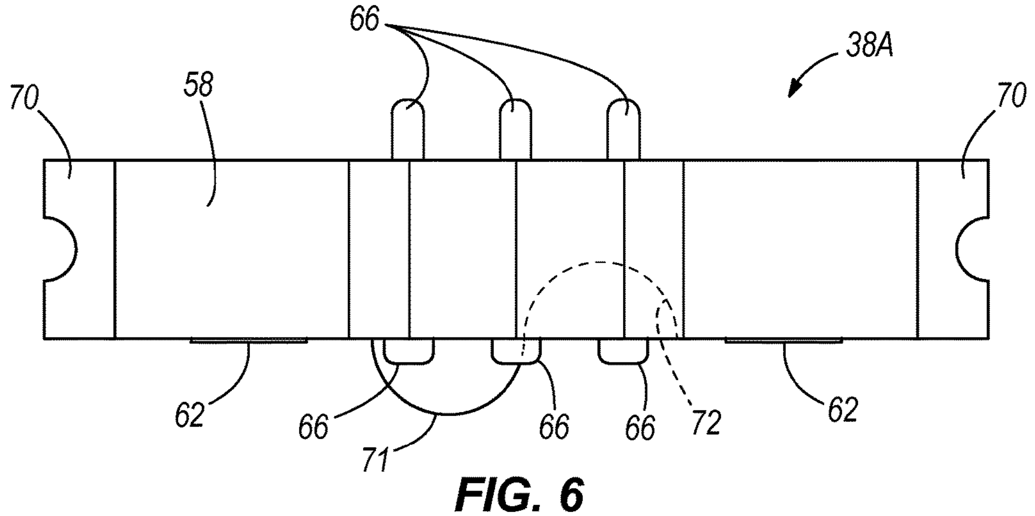
FIG. 6 is a top view of the magnetic connector shown in FIG. 5.

Referring now to FIGS. 5 and 6, an exemplary embodiment of a magnetic connector is illustrated. In the illustrated exemplary embodiment, the connector is a male magnetic connector 38A. Female magnetic connectors may be similar to the male connector except the female connectors may have spring probes 66 that project less from the connector. In some exemplary embodiments, a pair of magnetic connectors 38A/B are electrically coupled to a PCB 46 to provide a module 34. Alternatively, any number of magnetic connectors may be electrically coupled to a PCB 46, including one, and be within the intended spirit and scope of the present invention. The illustrated exemplary magnetic connector 38A, male version here, includes a housing 58 in which two magnets 62 are molded with surface poles exposed that act as the polarizing and locking elements between modules 34. In some exemplary embodiments, the housing 58 may be made of a non-conductive material such as plastic. Embedded in the housing 58 are three electrical conductors or spring probes 66 that are responsible for carrying the current from one module 34 to the next module 34. In addition and for extra support, the magnetic connector 38A is mounted on the PCB 46 through mounting tabs 70 on both sides of the connector 38A. The male connector described above mates with a female connector that looks similar, however, the spring probes 66 in the female connector may be replaced with metal plates, and the magnet exposed surface is opposite to that of the male connector. In other exemplary embodiments, the spring probes 66 in the female connector may be similar to the spring probes 66 in the male connector except they may project less from the connector housing 58 than the spring probes 66 of the male connector. Also note that each connector (both male and female) includes a protrusion 71 and an indentation or receptacle 72 in the housing 58. The protrusions 71 are adapted to insert and mate with indentations 72 in other connectors when the connectors are coupled together. This engagement between protrusions 71 and indentations 72 inhibits the blocks 34 from sliding with respect to each other. This design ensures that blocks 34 couple together to inhibit sliding between the blocks 34 and also facilitate coupling the blocks 34 in the correct manner. Users have a difficult time making mistakes or dangerous electrical connections as is often possible with other electronic components. This makes the present electronic building system 30 accessible and friendly for children, non-engineers, and users who have little or no experience in electronics.

While the connector 38A shown in FIGS. 5 and 6 includes three spring probes 66, any number of spring probes 66, including just one or many more than three, may be used to accommodate electrical current and/or communication from one module 34 to the next module 34. For example, the connector 38A may include four, five, six, or more electrical lines. Further, many means other than spring probes may be used to transmit electrical current and/or communication from one module 34 to another module 34, as would be recognized by one of skill in the art. In each system, the female connector 38B may be structured to appropriately receive the spring probes 66 or other current-transmission means from the male connector 38A, such that current is properly transmitted between the connectors 38A/B and the modules 34. In other exemplary embodiments, the connectors may not include a female connector and a male connector, but, rather, may include two similarly structured connectors that mate and facilitate transfer of electrical current and/or electrical communication from one module 34 to another module 34.

Figure 7:
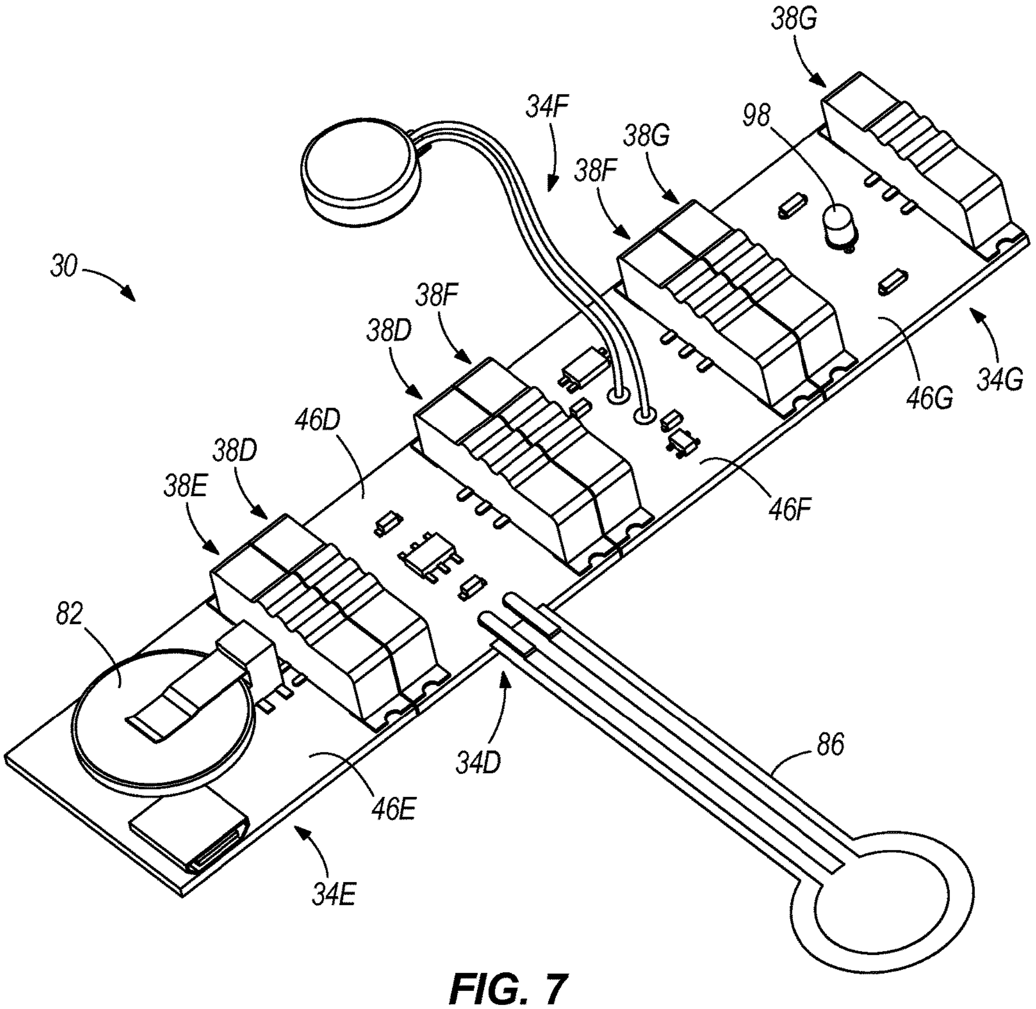
FIG. 7 is an exemplary configuration of four modules.

With reference to FIG. 7, another exemplary configuration of modules or blocks 34 is illustrated and this exemplary configuration provides a pressure sensor module 34D. In the illustrated exemplary embodiment, the power module is a battery block 34E such as, for example, a coin cell battery block. In this block 34E, a coin battery 82 delivers a little over 3 Volts stepped up to 5 Volts by the illustrated exemplary electronic circuit. The circuit also includes a discharge protection circuit, which demonstrates an example of how the electronic building system 30 may be designed to make the system easier to use and safe for users. The circuit may also include an embedded switch that enables a user to turn on or off the battery block 34E so as not to waste battery power. The next block connected to the battery block 34E is the pressure sensor module 34D, which reads the amount of pressure applied to a pressure sensor component 86 and outputs voltage in the range of 0 to 5 Volts depending on the amount of pressure applied. As more pressure is applied to the pressure sensor component 86, higher voltage transmits to the next modules. In this example, the next modules include a vibrating motor block 34F and an LED block 34G, both of which respectively vibrate more and illuminate brighter as the applied pressure increases. FIGS. 3, 4, and 7, among others, illustrate how the electronic building system 30 is standalone and requires no hardware platform or computer to be connected. The above-described exemplary system could be used, for example, by a child wanting to create his/her version of a carnival's strength meter. As pressure is applied with more strength through a finger or hammer, the toy vibrates more and the LED 98 gets brighter.

In some exemplary embodiments, each module 34 may include control and protection circuitry to facilitate safe and easy operation of the module 34. Additionally, each module 34 may include an operational amplifier component used in a buffer configuration in order to reduce the amount of overall current consumption on the overall system 30 of coupled modules 34. This assists with facilitating the cascading of multiple modules 34 without significant loss of power, as well as scaling the system 30 as may be desired. In other exemplary embodiments, the system 30 may include a booster module in the overall system of coupled modules 34 in order to boost the current and/or power traveling through the power lines and ensure proper functioning of all the modules 34 in the system 30.

Figure 8:
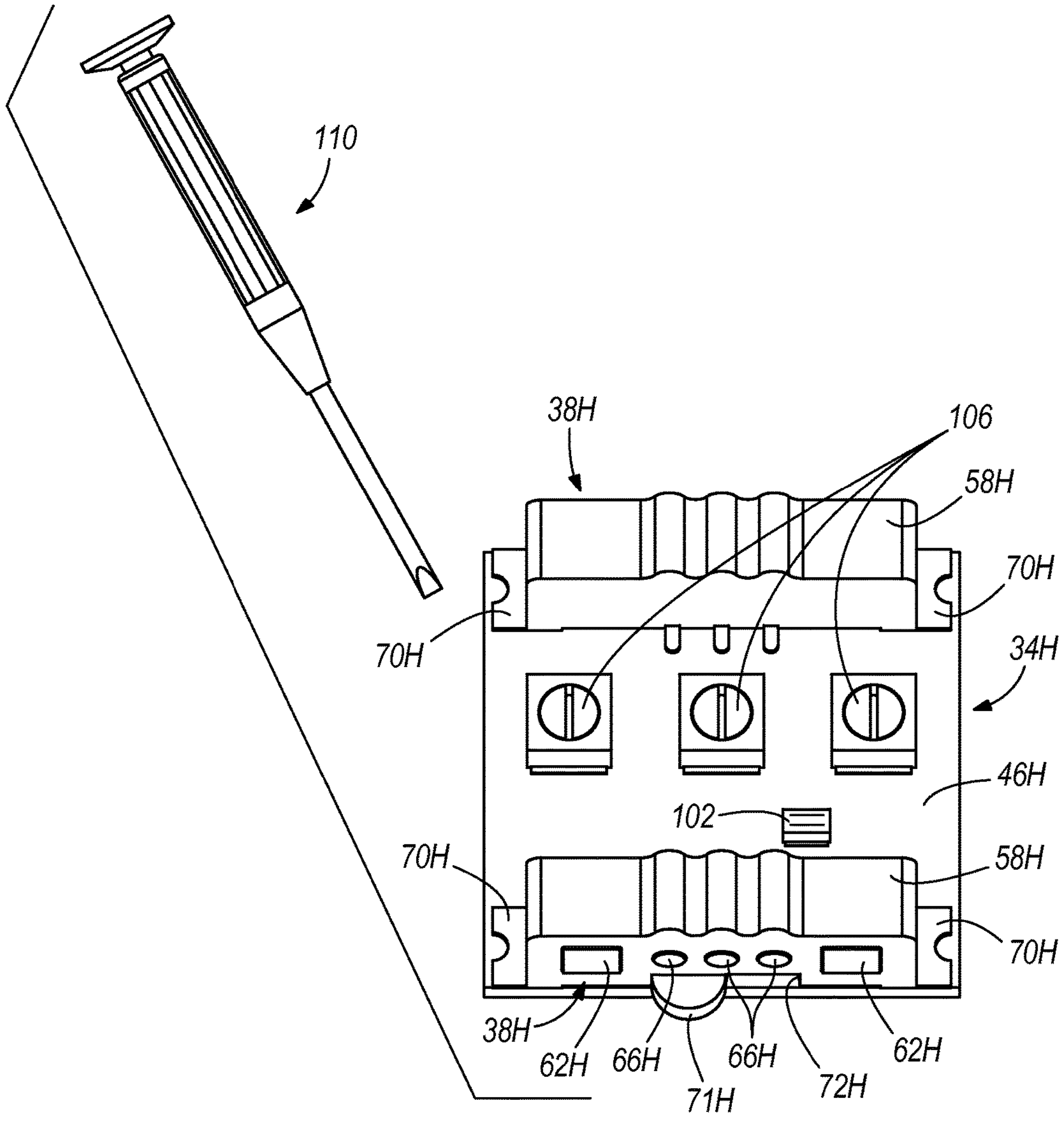
FIG. 8 is a top view of an exemplary module of the system featuring controls.

Beyond being able to produce discrete behaviors by cascading modules 34, the electronic building system 30 allows for programming of certain behavior and aesthetic of the modules 34 through controls. In FIG. 8, an exemplary Red Green Blue (RGB) LED block 34H is shown. In this module 34H, the output color of the RGB LED 102 is controlled by the value of a combination of three potentiometers or knobs 106 provided in the module 34H. By changing the value of each potentiometer (one for Red, one for Green, one for Blue) using a screwdriver 110 or other device, the user is able to adjust the LED 102 to a desired color. In other exemplary embodiments, the potentiometers 106 of this block 34H could be provided off the circuit board itself, and the color of the RGB LED 102 could be modified externally. In further exemplary embodiments, the potentiometers may include knobs or other manually adjustable devices, thereby eliminating the need for tools to perform adjustment.

Figure 9:
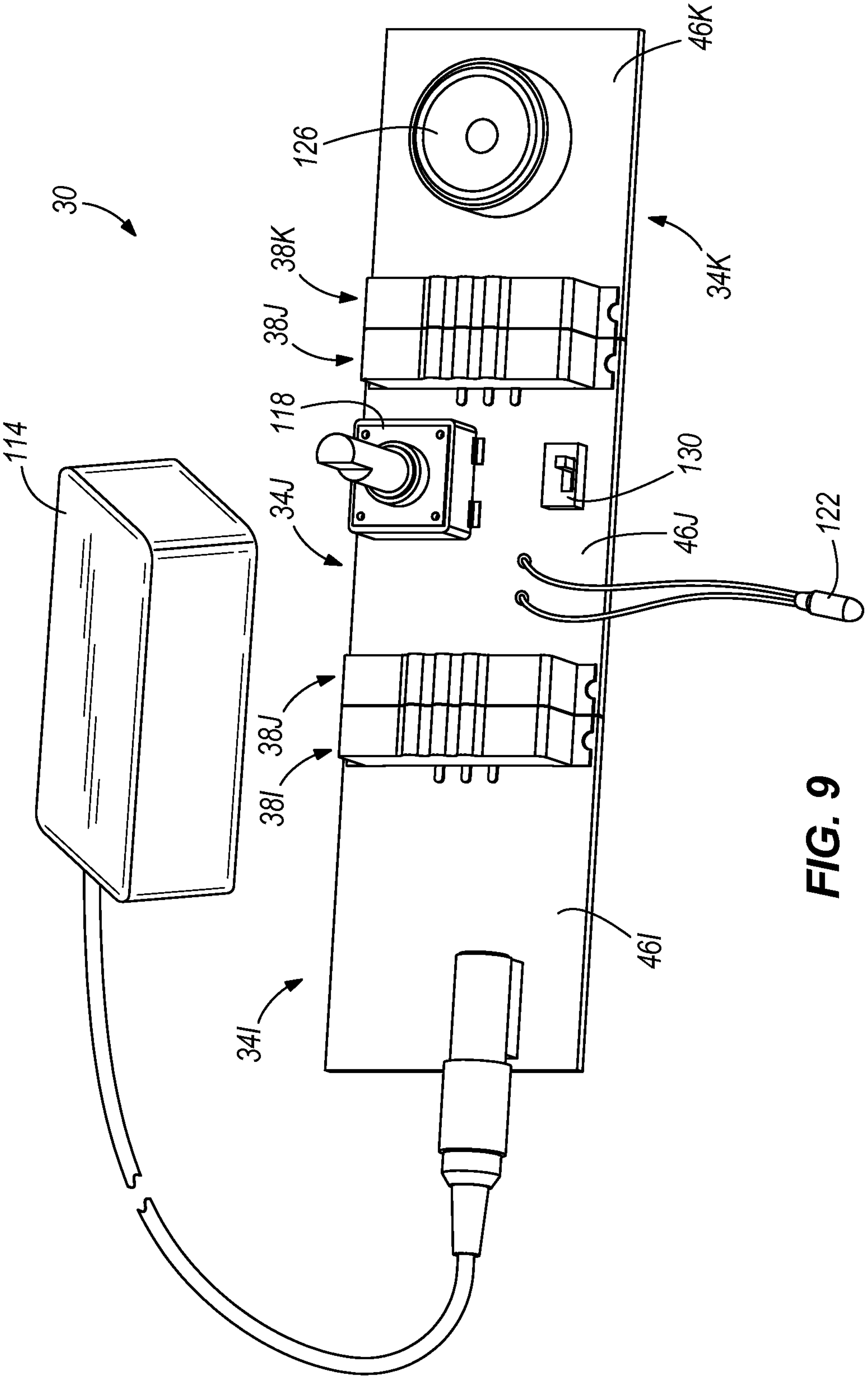
FIG. 9 is a perspective view of an exemplary set of three modules of the system including one module illustrating physical programming through controls.

Yet another example of programming behavior in the electronic building system 30 through controls is shown in FIG. 9. Again, the user is able to program behavior of the circuit by manipulating physical elements and without any code writing. In the illustrated exemplary embodiment, a 9 Volt battery 114 is shown and is part of the power module 34I, which is connected to a temperature sensor module 34J including a threshold component, followed by an audio module 34K. In this example, the temperature sensor module 34J may be more advanced than a traditional sensor module. The block 34J features a potentiometer 118 that may be adjusted to set a temperature threshold. If the temperature detected by a temperature sensor 122 is above the set temperature threshold, the module 34J outputs a high reading. This is an example of integrating logic with the simpler analog blocks in order to enable complex circuit configurations. In this example, an output of a high reading from the temperature sensor module 34J will cause the audio module 34K to activate and a speaker 126 to play a pre-recorded message associated with a high reading. For instance, this exemplary circuit could be used by a person wishing to have an alarm to turn on the Air Conditioning. When the temperature exceeds a pre-set threshold temperature, the audio module 34K could play back a message "time to turn on the AC!" Also, the audio module 34K may instead be replaced with a fan module, which may activate upon receiving a high temperature reading signal from the temperature sensor module 34J.

In some exemplary embodiments, the temperature sensor module may incorporate a mode switch 130 that can flip the behavior of the block 34J from 'normally-low' to 'normally-high'. In contrast to the first explained configuration (which was normally-low), a 'normally-high' setting would cause the module 34J to output a high reading except when the temperature exceeds the threshold. This means the audio module 34K would be playing recurrently until the room gets warmer, at which point the audio module 34K will cease to output audio. These controls, in addition to pre-programmed blocks, logic blocks and state blocks, will allow the system 30 to enable complex prototypes and circuits with no programming or electronics knowledge.

Figure 10:
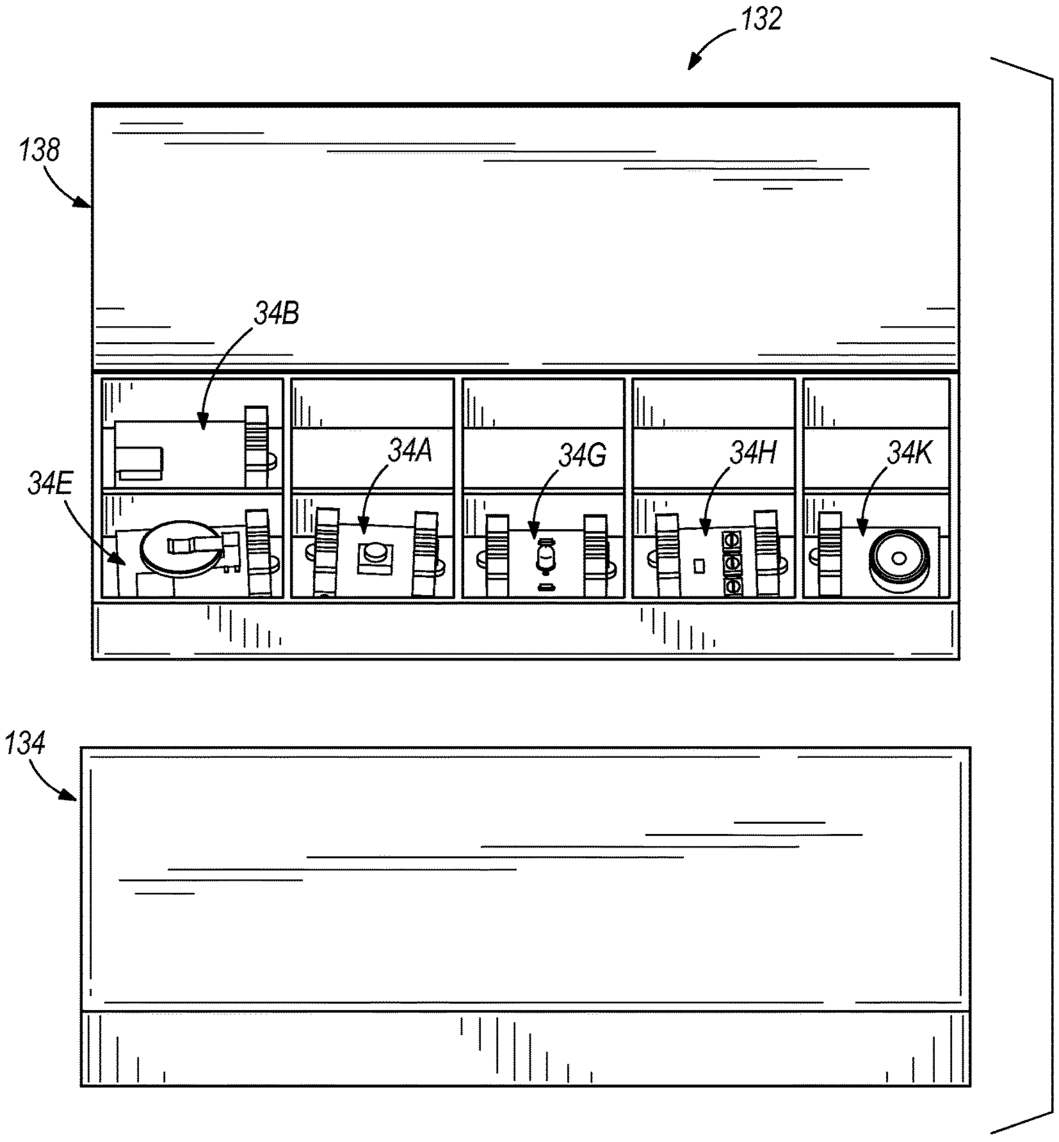
FIG. 10 is a perspective view of an exemplary packaged kit including a plurality of exemplary modules and an exemplary mounting board for mounting modules.

Referring now to FIG. 10, an exemplary kit 132 is illustrated. In the illustrated exemplary embodiment, the kit 132 may include a plurality of modules or blocks 34 and a substrate or mounting board 134, upon which modules 34 may be placed, supported, and or connected. The mounting board 134 may be any size and be made of any material. In some exemplary embodiments, the mounting board 134 is made of a non-conductive material. Additionally, the kit 132 may include a container 138 in which the modules 34 may be stored when not in use. The plurality of blocks 34 and substrate 134 may be the beginning of a kit or library that a user adds to by creating or acquiring new modules and kits, all fitting together as part of the electronic building system 30. The previous descriptions and drawings aim to serve as examples of configurations and modules enabled by the system. These are by no means restrictive or limiting, and those of ordinary skill in the art will understand and appreciate the existence of variations, combinations, and equivalents of the embodiments, methods, and examples herein.

With reference to FIGS. 11-16, the modules 34L, 34M, 34N, 34P, 34Q, and 34R may be uniquely configured to provide a quick visual indication to a user of each module's function. The modules may be uniquely configured in any manner and have any characteristic to identify the functionality of the modules. Additionally, any portion of the module 34 may be uniquely configured and have any characteristic to represent the unique configuration feature. For example, the modules may have a characteristic that uniquely identifies the modules by color-coding, patterning, or may include unique structuring such as shapes, housings, interconnection or couplings, etc. The illustrated exemplary embodiments demonstrate color-coding of the connectors 38 as the exemplary manner of uniquely configuring modules to provide visual indicators as to the function of the modules. However, it should be understood that this exemplary illustrated embodiment of color-coding connectors 38 is not intended to be limiting and the modules may be uniquely configured in any manner and be within the spirit and scope of the present invention. The functionality of the modules identified by the unique configurations and characteristics may be any type or level of functionality. For example, the unique configurations may indicate that the modules are input modules, power modules, wire modules, output modules, etc. In other examples, the unique configurations of the modules may be more specific such as, for example, an LED module, a 9-volt battery module, a cell battery module, a potentiometer module, a switch module, a pressure sensor module, a pulse module, a button module, a vibration motor module, a wire module, etc.

In the illustrated exemplary embodiment, color-coding provides the user with a quick visual confirmation of the type of module, the functionality of the module, as well as allowing the user to learn which color combinations are possible. To represent connectors 38 having various colors in FIGS. 11-16, the connectors 38 are shaded in different manners. Shading connectors 38 in different manners to illustrate various colors is an exemplary manner of representing various colors and is not intended to be limiting. Other manners of representing different colors are contemplated and all of such are intended to be within the spirit and scope of the present invention. Additionally, the connectors 38 are capable of having any color and are not limited to the exemplary colors and associated shading included in the figures.

Figure 11:
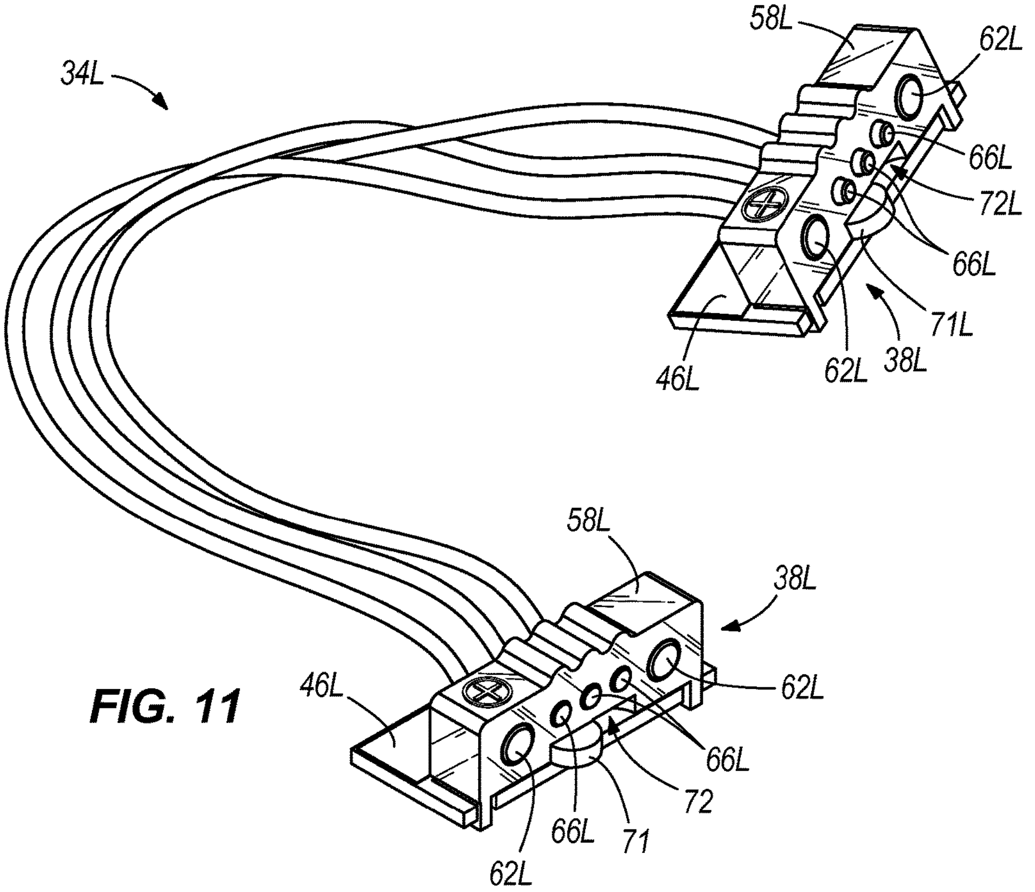
FIG. 11 is a perspective view of an exemplary wire module of the system.
Figure 12:
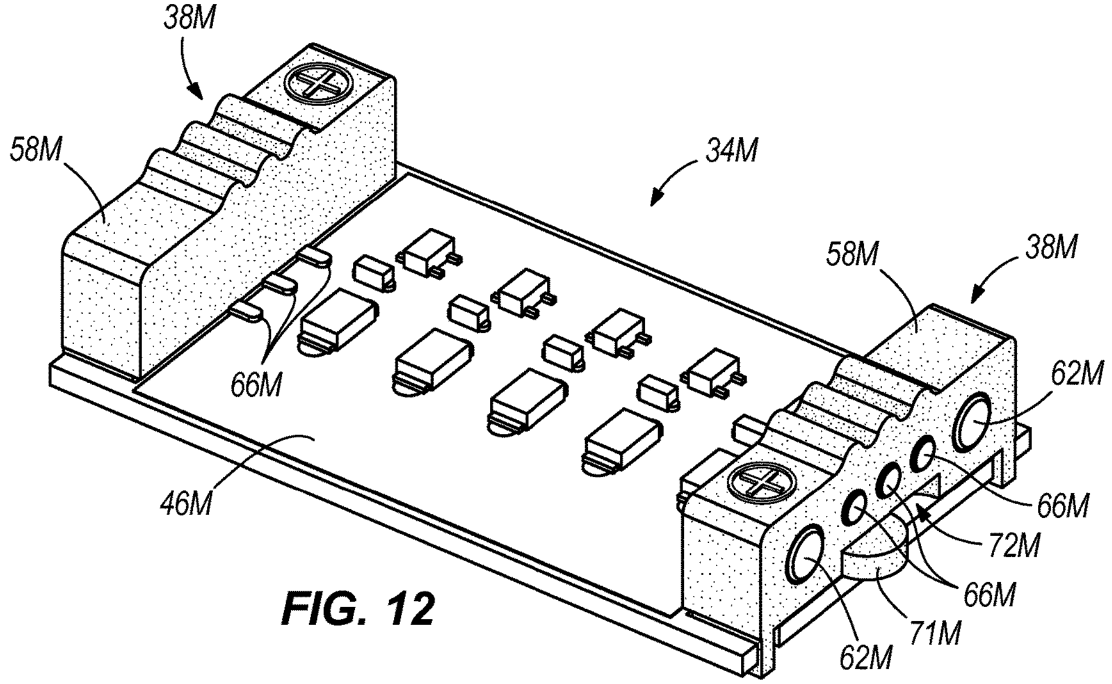
FIG. 12 is a top perspective view of an exemplary output module of the system.
Figure 13:
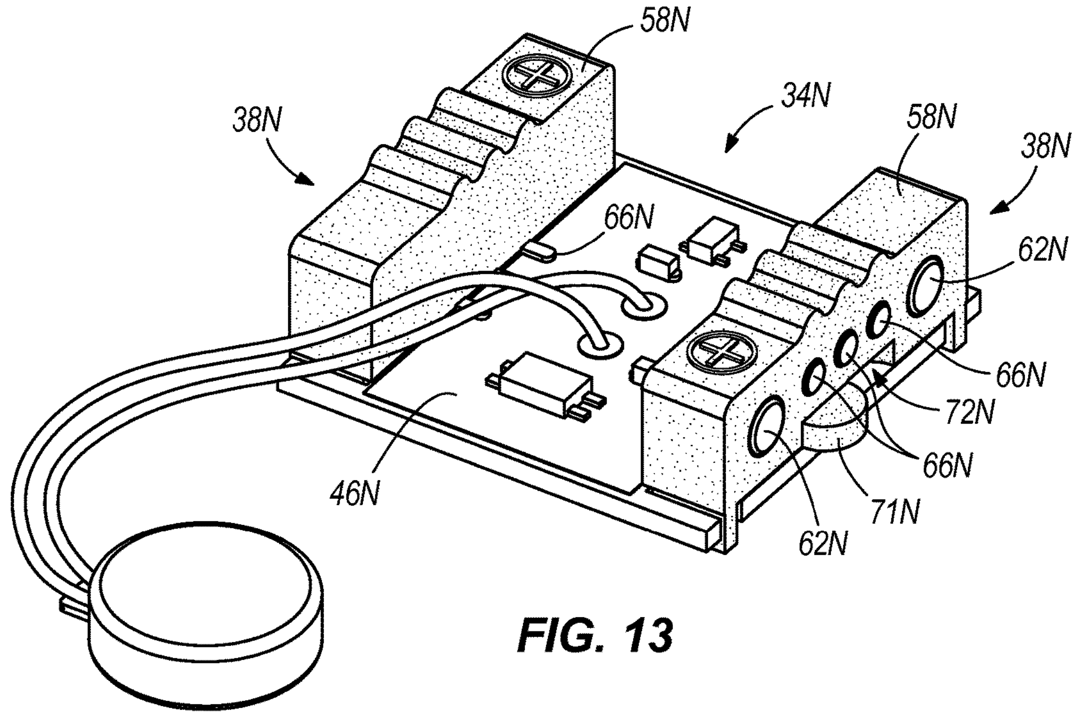
FIG. 13 is a top perspective view of another exemplary output module of the system.
Figure 14:
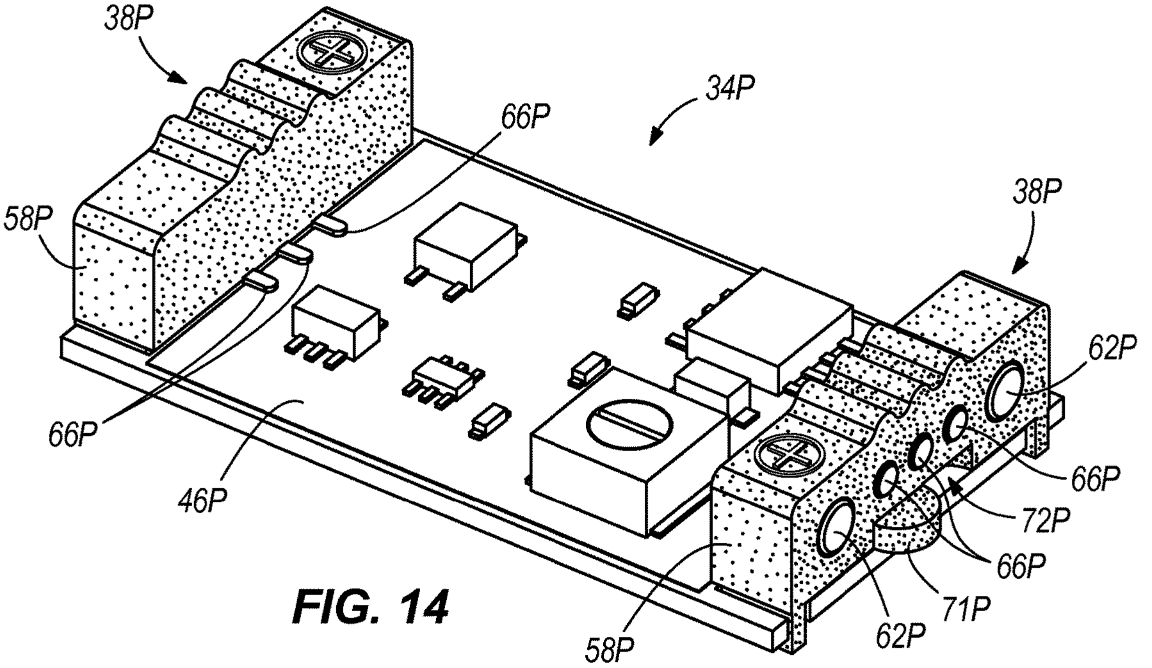
FIG. 14 is a top perspective view of an exemplary input module of the system.
Figure 15:
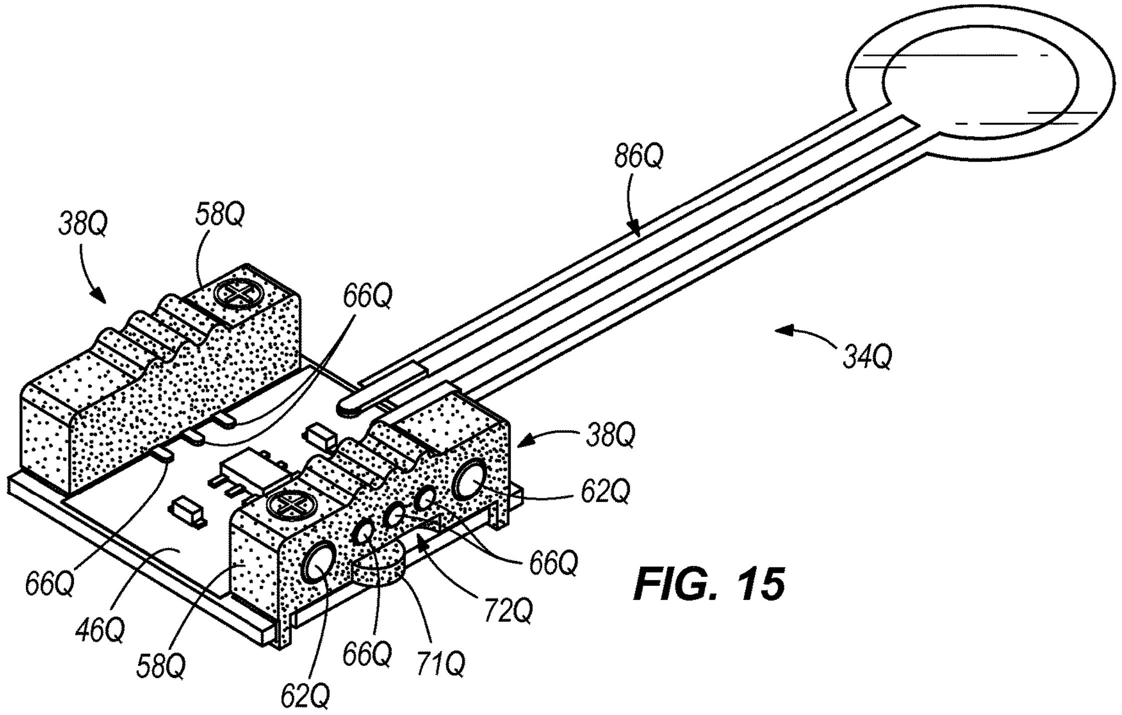
FIG. 15 is a top perspective view of another exemplary input module of the system.
Figure 16:
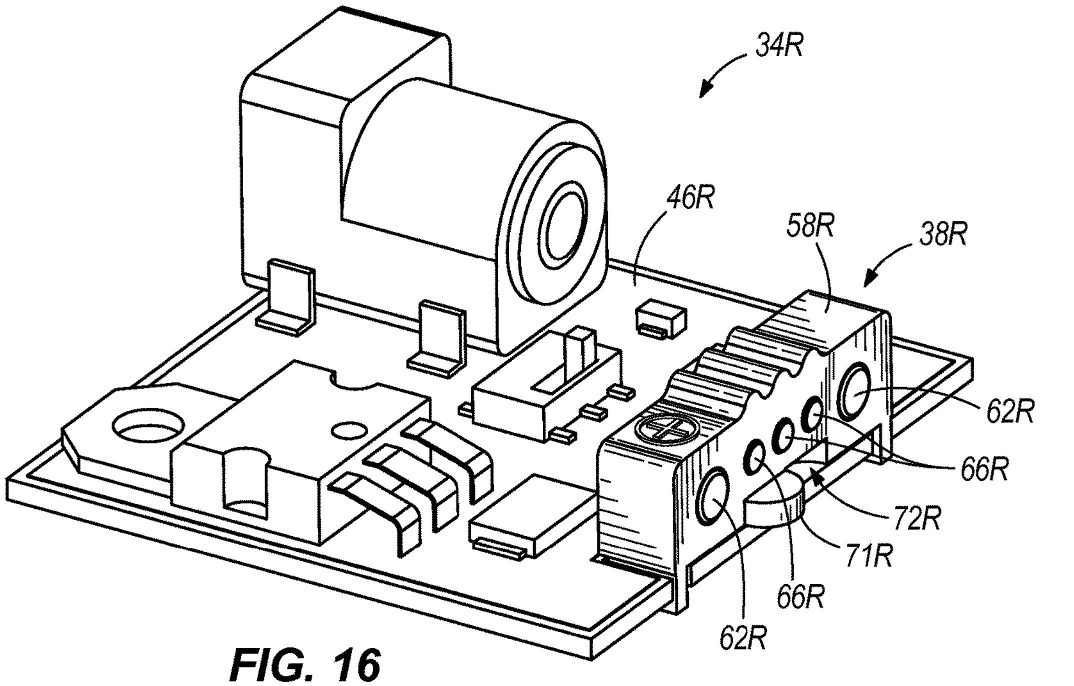
FIG. 16 is a top perspective view of an exemplary power input module of the system.
Figure 17:
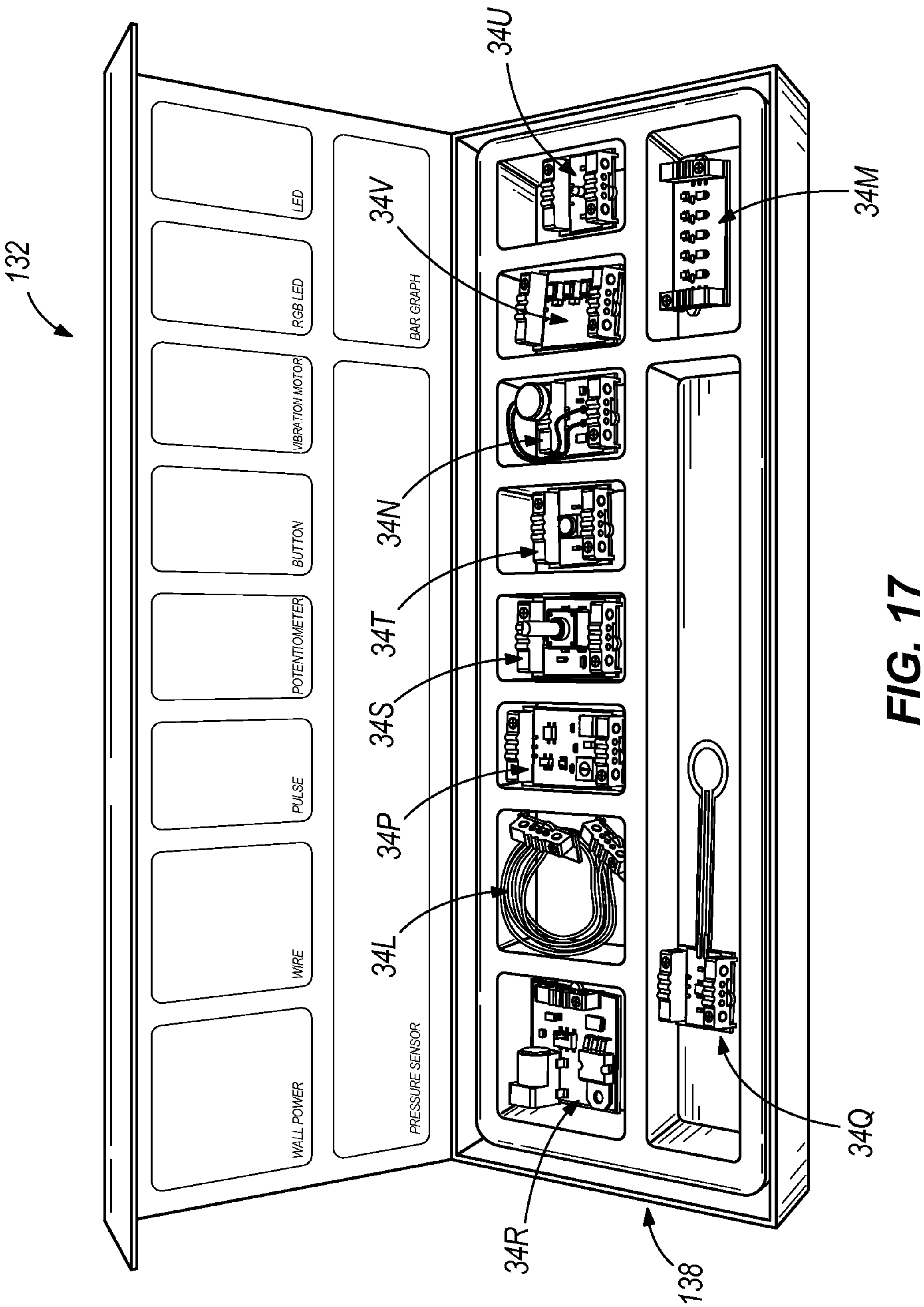
FIG. 17 is a top perspective view of an exemplary multi-module kit of the system.

According to one exemplary embodiment as shown in FIG. 11, wire modules 34L may include orange connectors 38L. Upon reading the instruction manual, receiving on-line instruction, or through trial-and-error, the user learns that orange connectors 38L may connect to other orange connectors 38L, to green connectors 38M, 38N of output modules (FIG. 12 depicting a bar graph 34M, and FIG. 13 depicting a vibration motor 34N), and/or to pink connectors 38P, 38Q of input modules (FIG. 14 depicting a pulse module 34P, and FIG. 15 depicting a pressure sensor 34Q), depending on the system 30 the user is attempting to build. Each system 30 will likely require a power module (FIG. 16 depicting a wall power module 34R), which will include blue color-coded connectors 38R according to one exemplary embodiment. In this illustrated exemplary embodiment and with reference to FIG. 17 illustrating a kit 132 associated with the exemplary system, the kit 132 may include a blue power module 34R, one or more orange wire modules 34L, a plurality of pink input modules 34P, 34Q, 34S, 34T, and a plurality of green output module 34M, 34N, 34U, 34V. Other exemplary kits may include any number of modules 34 including any possible functionality and be within the intended spirit and scope of the present invention.

Figure 18:
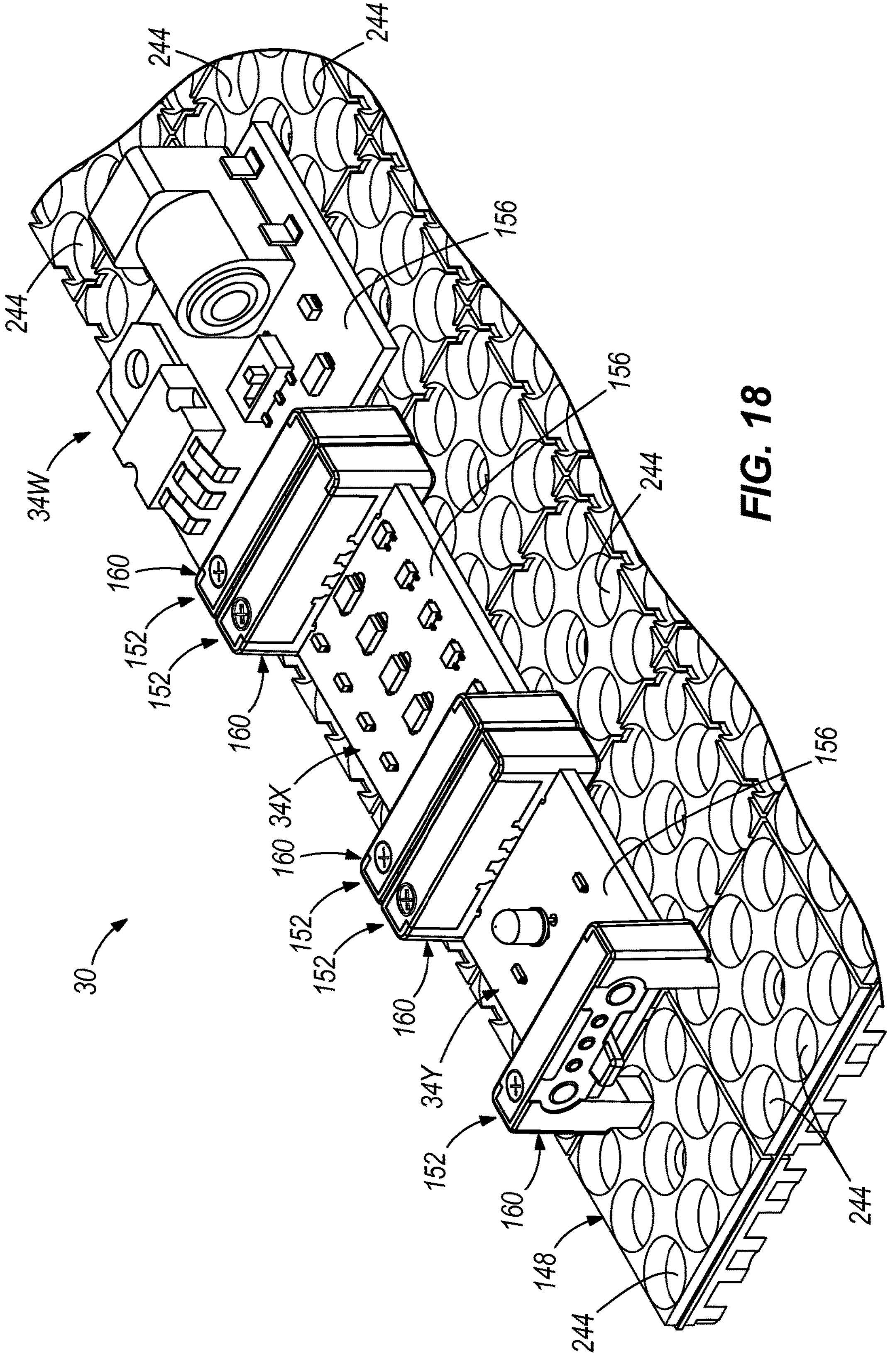
FIG. 18 is a top perspective view of other exemplary modules and another exemplary mounting board of the exemplary system, each module including at least one of another exemplary connector for coupling together modules.

Referring now to FIG. 18, another exemplary system 30 is illustrated including a plurality of exemplary modules 34W, 34X, and 34Y and a mounting board or substrate 148 upon which to couple and support the modules. The system 30 illustrated in FIG. 18 is capable of including any type of module described herein or any other type of module having any type of functionality. Thus, the exemplary modules illustrated and described herein in connection with FIG. 18 are not intended to be limiting. The mounting board 148 may be any size and may be made of any material. In some exemplary embodiments, the mounting board 148 may be 4 inches by 12 inches. In other exemplary embodiments, the mounting board 148 may be made of any non-conductive material. In further exemplary embodiments, the mounting board 148 may be broken up or otherwise separated into smaller portions to a desired size appropriate to the desired application. In such embodiments, the mounting board 148 may either be made of a material and have a configuration that enables breaking or separation of the mounting board 148 into smaller portions, or the mounting board 148 may include perforations, areas of decreased thickness, or other structural characteristics that provide predetermined locations for facilitating easy breaking or separating of the mounting board 148 into smaller portions.

As indicated above, modules are adapted to have a variety of different types of functionality and include the appropriate connectors, circuit boards, and associated electrical components coupled to the circuit boards to perform the desired functionality. The modules shown in the illustrated exemplary embodiment are for exemplary and demonstrative purposes, and are not intended to be limiting. The exemplary illustrated modules include a wall power module 34W (power), a bar graph module 34X (input), and an LED module 34Y (output).

Figure 19:
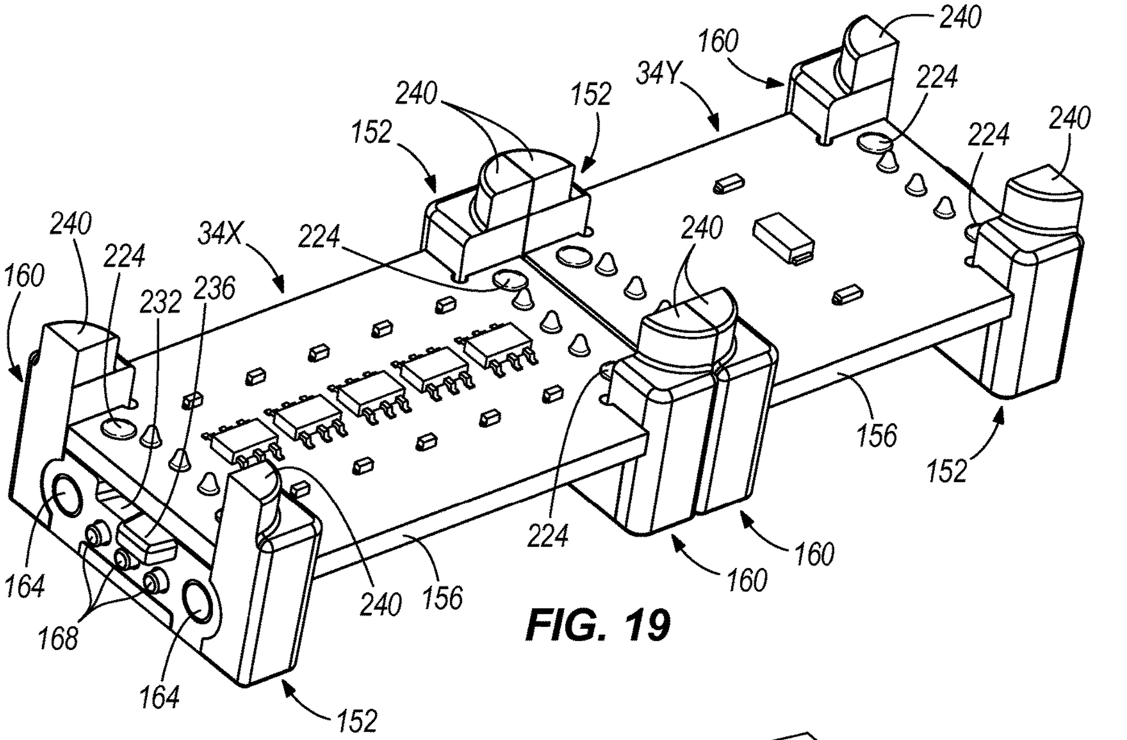
FIG. 19 is a bottom perspective view of two coupled together modules shown in FIG. 18.
Figure 20:
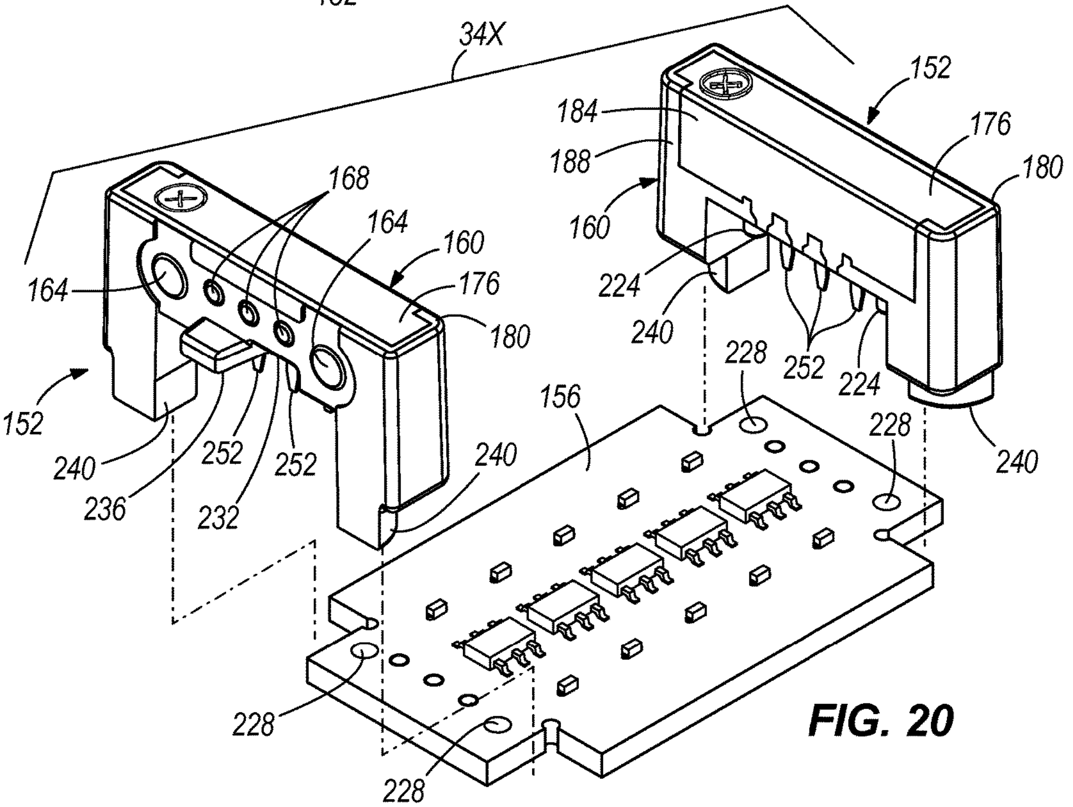
FIG. 20 is a top exploded view of one of the modules shown in FIG. 18.
Figure 21:
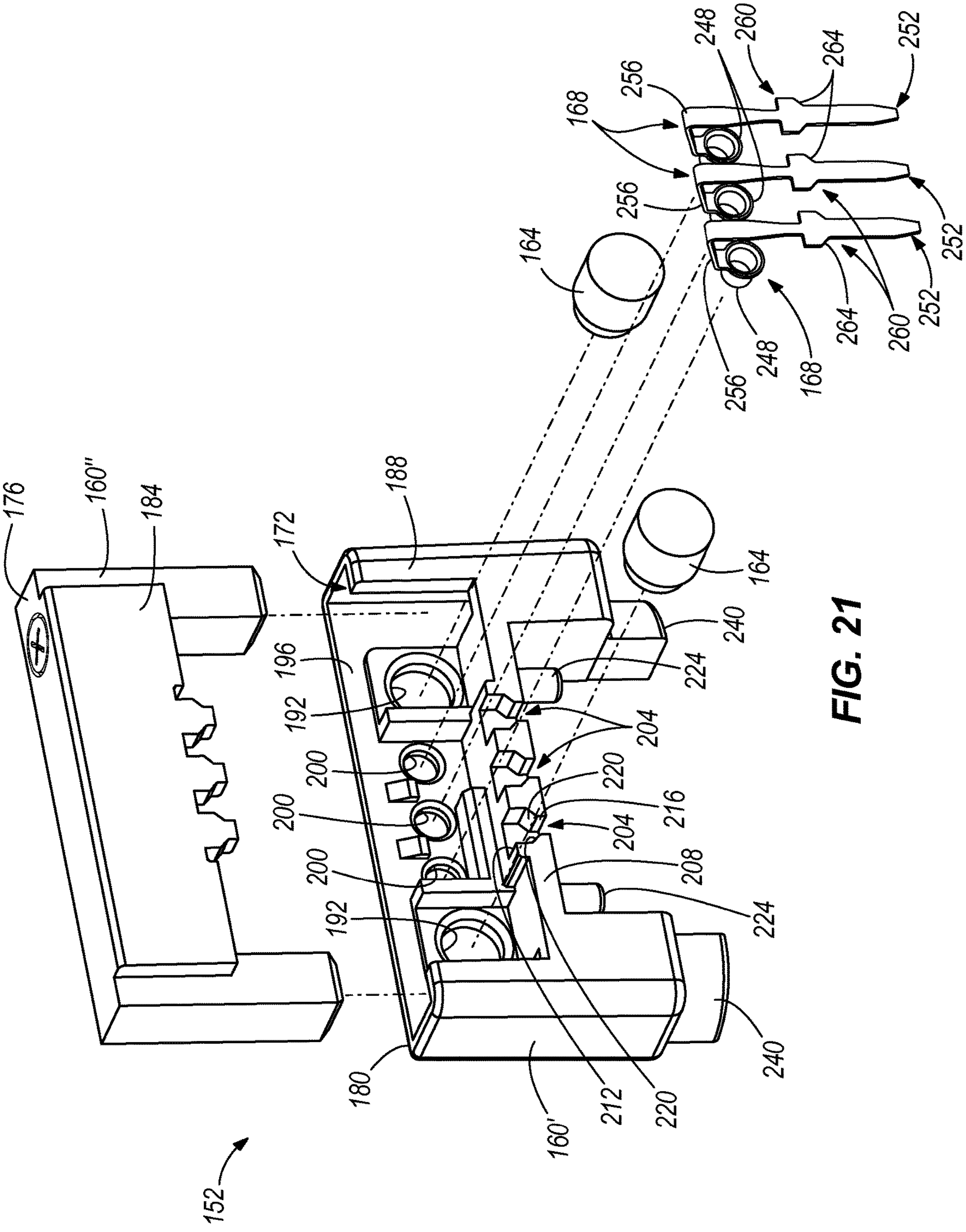
FIG. 21 is a top exploded view of one of the connectors shown in FIG. 18.

Referring now to FIGS. 19-21, each module 34X and 34Y are illustrated and each includes a pair of connectors 152 and a circuit board 156 appropriate to the desired functionality of the module. The module will include the appropriate electrical components to perform the desired functionality of the module. Each connector 152 includes a housing 160 comprised of two portions 160', 160" (see FIG. 21) coupled together, a pair of magnets 164, and a plurality of electrical conductors 168. The two portions of the housing 160 may be coupled together in a variety of manners such as, for example, heat staking, ultrasonic welding, adhesion, press-fit, friction-fit, interference-fit, snap fit or other positive locking manner, etc., and may be made of a variety of different materials such as, for example, plastic (e.g., ABS plastic), or other non-conductive materials. A first portion 160' of the housing defines a cavity 172 for receiving the second portion 160" of the housing therein. The cavity 172 is complementarily shaped to the second portion 160" to ensure a top surface 176 of the second portion 160" is substantially flush with a top surface 180 of the first portion 160' (see FIGS. 20 and 21) and a side surface 184 of the second portion 160" is flush with a side surface 188 of the first portion 160' when the two portions 160', 160" are coupled together.

The first portion 160' of the housing also defines a pair of magnet apertures 192 (see FIG. 21) in a side surface 196 thereof in which the magnets 164 are supported. In the illustrated embodiment, the magnets 164 are cylindrical in shape, thereby providing a circular cross-section taken along a plane perpendicular to a longitudinal extent of the magnet 164. Thus, the magnet apertures 192 defined in the first portion 160' of the housing are circular in shape. It should be understood that the magnets 164 may having any shape and the magnet apertures 192 may similarly have any shape that complements the shape of the magnets 164. For example, if the cross-sectional shape of the magnets is square, then the magnet apertures in the first portion of the housing may be square. In other exemplary embodiments, the magnet apertures may have shapes that are not complementary to the shape of the magnet. In such embodiments, the magnetic aperture may be any shape that inhibits the magnet from passing through the magnetic aperture and escaping the housing 160 of the connector. For example, the magnet may be cylindrical in shape, thereby providing a circular cross-section, and the magnet aperture may be square such that the square is sized sufficiently small to inhibit the magnet from passing through the aperture.

Additionally, the first portion 160' of the housing defines electrical conductor apertures 200 in the side surface 196 thereof for receiving and supporting a portion of the electrical conductors 168 (described in more detail below). In the illustrated exemplary embodiment, the electrical conductor apertures 200 are circular in shape complementary to the shape of a portion of the electrical conductors 168 received therein. Similarly to the magnet apertures 192, the electrical conductor apertures 200 may have any shape and be complementary to the shape of a portion of the electrical conductors 168 received therein.

The first portion 160' of the housing further defines a plurality of conductor slots 204 (see FIG. 21) in a bottom surface 208 thereof for receiving the conductors 168 therein when the housing 160 is assembled. Each conductor slot 204 includes an upper end 212 having a first dimension, a bottom end 216 having a second dimension smaller than the first dimension, and tapered side surfaces 220 tapering from large to small from the upper end 212 to the lower end 216. The shape of the conductor slots 204 is complementary to the shape of the electrical conductors 168 in order to provide sufficient support to the electrical conductors 168 when the housing 160 is assembled.

Further, the first portion 160' of the housing includes a pair of projections 224 extending downward from a bottom surface 208 thereof for coupling the connector 152 to the circuit board 156 of the module 34. In the illustrated exemplary embodiment, the projections 224 are cylindrical in shape and may insert into apertures 228 (see FIG. 20) defined in the circuit board 156. Subsequently to inserting the projections 224 into the circuit board apertures 228, the projections 224 may be deformed to inhibit them from withdrawing from the apertures 228 in the circuit board 156. The projections 224 may be deformed in a variety of different manners such as, for example, melting or heating the projections 224, bending, smashing, or any other manner that sufficiently deforms the projections 224 to inhibit them from withdrawing from the apertures 228 in the circuit board 156.

The housing 160 also defines a receptacle 232 in a side surface thereof and includes a projection 236 extending from the side surface and positioned adjacent the receptacle 232. Such a receptacle 232 and projection 236 are included in each connector housing 160 and assist with proper alignment and coupling of modules 34 together. The receptacle 232 is shaped complementary to a shape of the projection 236 such that when a projection 236 is received in the receptacle 232 the projection 236 substantially fills the receptacle 232. When coupling two modules 34 together, the connectors 152 are aligned with the projection 236 on each connector 152 substantially aligned with the receptacle 232 on the other connector 152, and the modules 34 are moved together until the magnetic force of the four magnets 164 on the two connectors 152 is sufficient to pull the connectors 152 together, thereby causing the projections 236 to insert into the receptacles 232. Upon connection, the projections 236 and receptacles 232 of the connectors 152 cooperate to inhibit substantial lateral and vertical movement of the modules 34 relative to one another.

With continued reference to FIGS. 19-21, the first portion 160' of the housing includes a pair of mounting members 240 extending downward there from and adapted to engage complementarily shaped receptacles 244 defined in the mounting board 148 (see FIG. 18). The mounting members 240 and the receptacles 244 are configured to provide adequate support to the modules 34 when mounted on the mounting board 148. In the illustrated exemplary embodiment, the mounting members 240 have a shape comprised of a quarter of a circle and the receptacles 244 on the mounting board 148 are circular in shape. When two connectors 152 on adjacent modules 34 are coupled together, the two mounting members 240 on the two connectors 152 form a semicircle that may friction fit into the receptacles 244 in the mounting board 148.

With continued reference to FIGS. 19-21, the electrical conductors 168 have a spring characteristic that allows for movement of the conductors 168 as a result of forces applied thereto. This spring characteristic that facilitates movement of the conductors 168 helps maintain contact with electrical conductors 168 on an adjacent module 34 coupled to the present module 34 during manipulation of the modules 34. Such manipulation may result in forces applied to the modules 34 causing movement of the modules 34 relative to one another. In the illustrated exemplary embodiment, each electrical conductor 168 includes an engagement portion 248 (see FIG. 21) positioned within a respective electrical conductor aperture 200, a coupling portion 252 extending downward and adapted to engage and electrically communicate with the circuit board 156, and a middle portion 256 (see FIG. 21) extending between the engagement portion 248 and the coupling portion 252. The engagement portion 248 is adapted to engage an electrical conductor 168 of an adjacent module 34 coupled to the present module 34. Due to the electrical conductor 168 being made of a conductive material, the electrical current travels through the electrical conductor 168 of the present module 34 to its circuit board 156. Each electrical conductor 168 includes an enlarged portion 260 (see FIG. 21) positioned between ends of the conductor 168 that fits into a respective conductor slot 204. The enlarged portion 260 has a complementary shape to the conductor slot 204 to provide vertical and horizontal support to the electrical conductor 168 when the housing 160 is assembled. In the illustrated exemplary embodiment, the enlarged portion 260 includes a tapered portion 264 (see FIG. 21) that complements the tapered surfaces 220 of the conductor slot 204.

Figure 22:
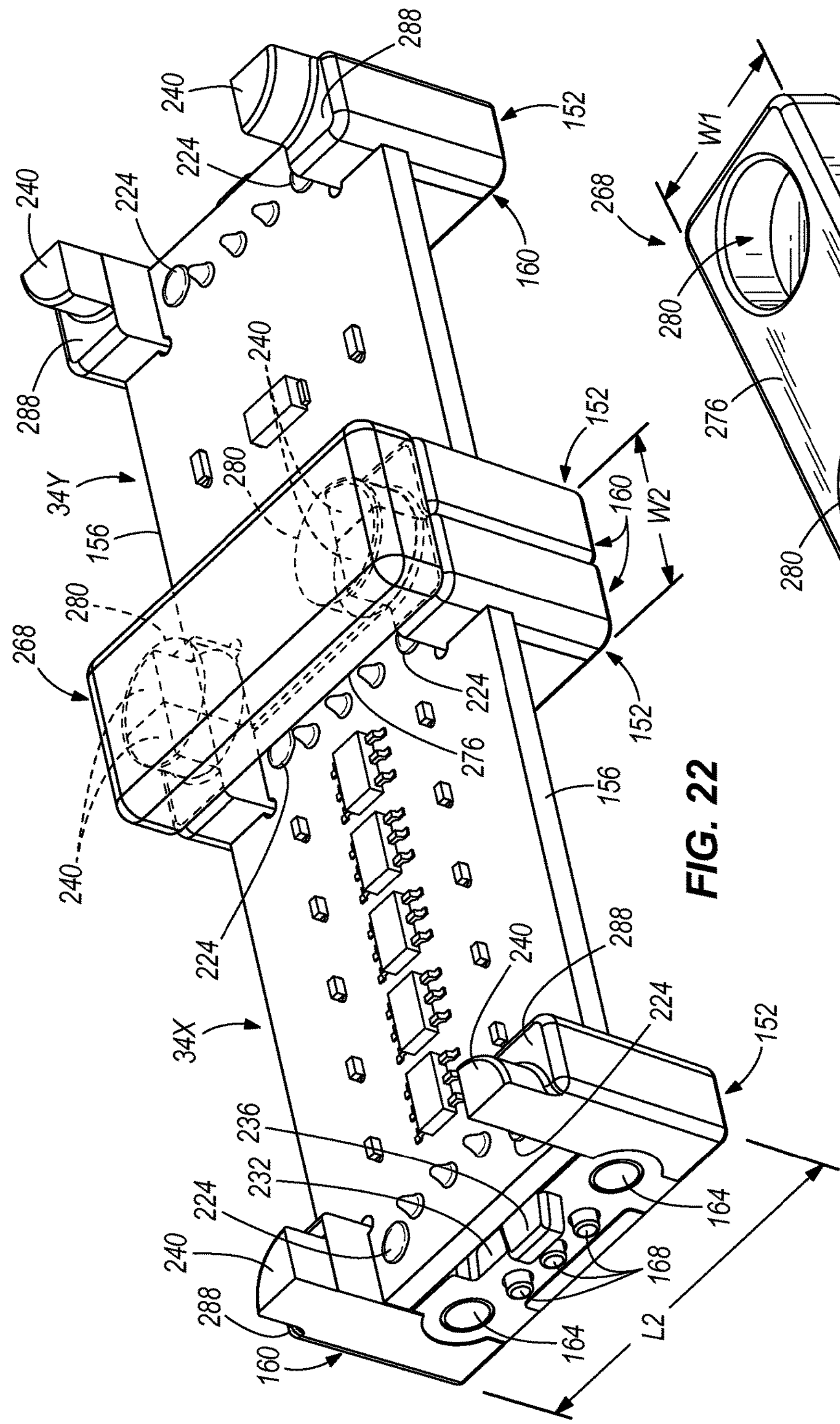
FIG. 22 is a bottom perspective view of two exemplary modules coupled together and an exemplary support member coupled to two of the connectors.
Figure 23:
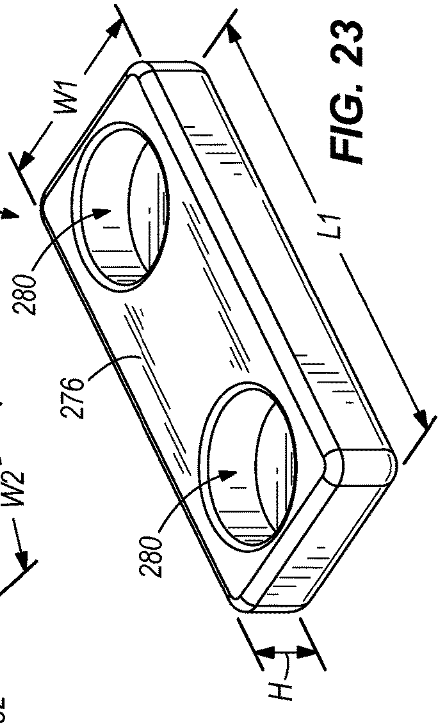
FIG. 23 is a top perspective view of the support member shown in FIG. 22.

Referring now to FIGS. 22 and 23, a support member 268 is coupled to two coupled together modules 34 to provide additional support to the coupled modules 34. In some exemplary embodiments, the support member 268 is used instead of the mounting board 148 to provide modules 34 with additional support. In other exemplary embodiments, the support member 268 may be configured to allow both the support member 268 and the mounting board 148 to provide support to coupled together modules 34. In the illustrated exemplary embodiment, the support member 268 includes a pair of receptacles 280 defined in a top surface 276 thereof for receiving mounting members 240 of coupled together modules 34. The receptacles 280 in the support members 268 are similarly sized, shaped and spaced apart as the receptacles 244 in the mounting board 148. The support member 268 also has a height H that, when two modules 34 are coupled to each other and to the support member 268, a top surface 276 of the support member 268 is substantially flush with and mates or engages with a bottom surface 288 of the housing 160. Also in the illustrated exemplary embodiment, the support member 268 includes a width W1 that is substantially similar to a width W2 of two coupled together connectors 152 and a length L1 that is substantially similar to a length L2 of the two coupled together modules 34. Alternatively, the support member 268 may have configurations different than the illustrated exemplary embodiment as long as the support member 268 provides support to coupled together modules 34. When multiple modules 34 in a system 30 are coupled together, a support member 268 may be coupled to each pair of coupled together connectors 152 in the system 30. Thus, the system 30 may include any number of support members 268 therein and be within the intended spirit and scope of the present invention.

Figure 24:
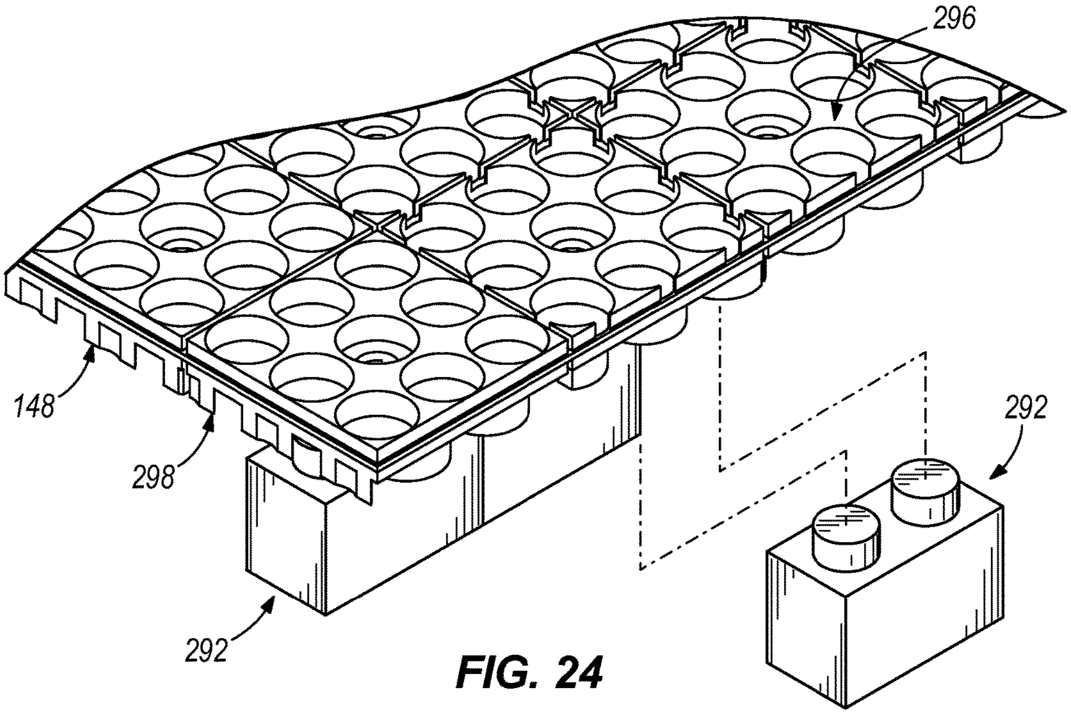
FIG. 24 is a top perspective view of an exemplary mounting board coupled to an exemplary configuration of toy building blocks.
Figure 25:
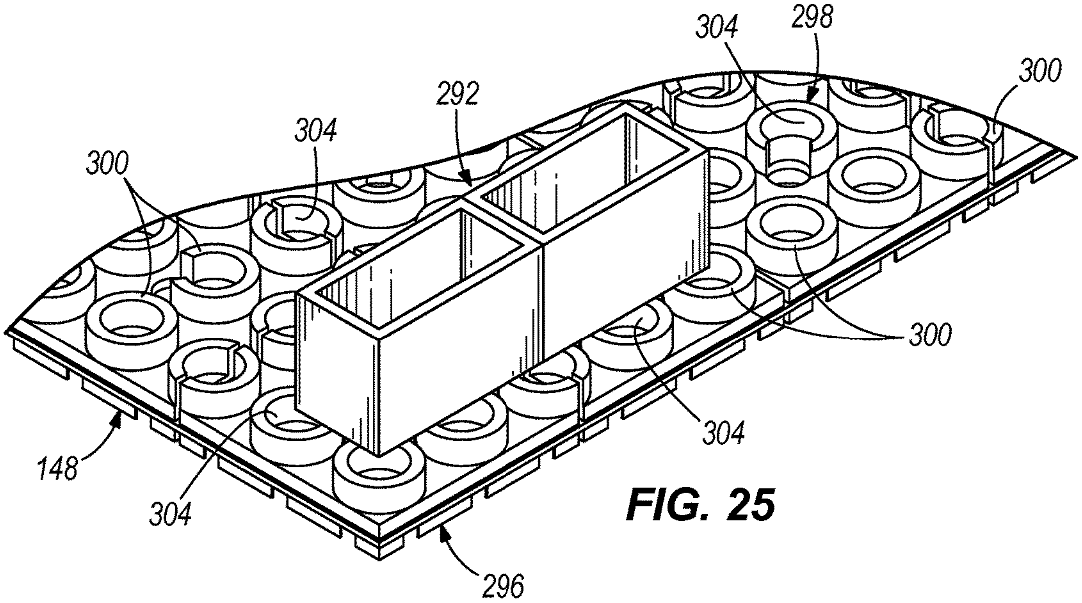
FIG. 25 is a bottom perspective view of the mounting board and exemplary toy building blocks shown in FIG. 24.

The exemplary systems 30 disclosed herein are adapted to cooperate with other types of systems to bring the functionality and features of the exemplary systems 30 to the other types of systems. The exemplary systems 30 may cooperate with any type of other system and be within the intended spirit and scope of the present invention. With reference to FIGS. 24 and 25, an exemplary mounting board 148 of an exemplary system 30 of the present invention is shown cooperating with a toy building block system 292 such as, for example, a LEGO® building block system 292. The illustrated exemplary systems are not intended to be limiting, but, rather, are for exemplary and demonstrative purposes. In the illustrated exemplary embodiment, the mounting board 148 is configured to cooperate with the exemplary LEGO building block system 292 and, in particular, is configured to couple to a LEGO building block system 292. A first side 296 of the mounting board 148 (e.g., a top side) includes the plurality of receptacles 244 appropriately spaced for receiving connectors 152 of modules 34. A second side 298 of the mounting board 148 (e.g., a bottom side) includes a plurality of projections 300 having cavities 304 defined therein that are appropriately spaced from one another to facilitate coupling to the LEGO building block system 292. As indicated above, the systems 30 of the present invention may couple to any type of other systems and, accordingly, the second side 298 of the mounting board 148 may be configured in any manner to accommodate any type of other system to which the mounting board 148 is intended to couple.

It should be understood that the structures, features, functionality, and other characteristics of the various exemplary embodiments of the systems disclosed herein and illustrated in FIGS. 1-25 may be combined with each other in any manner and in any combination and all of such manners and combinations are intended to be within the spirit and scope of the present invention.

As described above in the many examples of modules and systems, numerous modules may be coupled together to achieve various functionalities of the systems. Modules may be coupled in a cascading manner in which the inclusion of one module in the system may affect the functionality of downstream modules in a first manner and inclusion of a different module in the system may affect the function of downstream modules in another manner different than the first manner. That is, modules coupled together in a system may have dependencies upon one another to affect functionality thereof and of the entire system. A simple example to demonstrate this concept, but is not intended to be limiting, comprises a system include three modules: A power module, a button module, and an LED module. The button module and the LED module are dependent on the power module, and the LED module is dependent on the button module. To demonstrate the dependency of the button module and the LED module on the power module considering the following: If the power module is not providing any power, then neither the button module nor the LED module can operate in their intended manner. Similarly, to demonstrate the dependency of the LED module on the button module, if the button is not depressed or otherwise activated to close the circuit, the LED module will not be illuminated, and if the button is depressed, the LED module will be illuminated. In other words, cascading modules in a system affect operation and functionality of downstream modules.

The foregoing description has been presented for purposes of illustration and description, and is not intended to be exhaustive or to limit the invention to the precise form disclosed. The descriptions were selected to explain the principles of the invention and their practical application to enable others skilled in the art to utilize the invention in various embodiments and various modifications as are suited to the particular use contemplated. Although particular constructions of the present invention have been shown and described, other alternative constructions will be apparent to those skilled in the art and are within the intended scope of the present invention.

What is claimed is:

1. An electrical module, comprising:

a circuit board;

a housing including a side surface fixedly coupled to the circuit board;

at least three electrical conductors coupled to the housing and including an engagement portion proximate the side surface of the housing, the engagement portion of each of the at least three electrical conductors being adapted to engage a different electrical conductor of a device distinct from the apparatus;

a projection disposed outside the side surface of the housing; and a receptacle defined relative to the side surface of the housing, the projection configured to be received within a receptacle of a device distinct from the electrical module and the receptacle configured to receive a projection of the device.

2. The electrical module of claim 1, further comprising:

a coupling member coupled to the housing and configured to couple the side surface of the housing to the device.

3. The electrical module of claim 2, wherein the coupling member is a first magnet and the device includes a second magnet, the first magnet configured to couple the side surface of the housing to the device via the second magnet.

4. The electrical module of claim 2, wherein the electrical module includes a second coupling member coupled to the housing and configured to couple the side surface of the housing to the device, the at least three electrical conductors being positioned between the first coupling member and the second coupling member.

5. The electrical module of claim 1, wherein the at least three electrical conductors include a coupling portion adapted to engage and electrically communicate with the circuit board.

6. The electrical module of claim 1, wherein the housing has a characteristic associated therewith that provides a visual indication of a functionality associated with the electrical module.

7. The electrical module of claim 1, wherein the characteristic is a color of the housing.

8. The electrical module of claim 1, wherein the housing has a mounting portion configured to couple the electrical module to at least one block of an interlocking block system.

9. An electrical module, comprising:

a circuit board;

a connector coupled to the circuit board, the first connector including a housing defining a side surface, the housing fixedly coupled to the circuit board;

an electrical conductor coupled to the housing and including a coupling portion and an engagement portion, the coupling portion being adapted to engage and electrically communicate with the circuit board, the engagement portion being proximate the side surface of the housing;

a projection disposed outside the side surface of the housing;

a receptacle defined relative to the side surface of the housing, the projection configured to be received within a receptacle of a device distinct from the electrical module and the receptacle configured to receive a projection of the device; and the housing having a mounting portion configured to couple the electrical module to at least one block of an interlocking block system.

10. The electrical module of claim 9, further comprising:

a coupling member coupled to the housing and configured to couple the side surface of the housing to the device.

11. The electrical module of claim 10, wherein the coupling member is a first magnet and the device includes a second magnet, the first magnet configured to couple the side surface of the housing to the device via the second magnet.

12. The electrical module of claim 10, wherein the coupling member is a first coupling member, the electrical module includes a second coupling member coupled to the housing and configured to couple the side surface of the housing to the device, the conductor being positioned between the first coupling member and the second coupling member.

13. The electrical module of claim 9, wherein the housing has a characteristic associated therewith that provides a visual indication of a functionality associated with the electrical module.

14. The electrical module of claim 9, wherein the characteristic is a color of the housing.

15. A system, comprising:

a plurality of electrical modules selectively couplable together to transmit electrical current from a first electrical module from the plurality of electrical modules to a second electrical module from the plurality of electrical modules, each electrical module from the plurality of electrical modules having at least one functionality associated therewith, and including a connector adapted to couple to a connector of another one of the electrical modules, the first electrical module from the plurality of electrical modules having a first functionality and not a second functionality and not a third functionality, the second electrical module from the plurality of electrical modules having the second functionality and not the first functionality and not the third functionality, and a third electrical module from the plurality of electrical modules having the third functionality and not the first functionality and not the second functionality, each connector of each electrical module from the plurality of electrical modules includes at least three conductors, when the connectors are coupled together, the functionality of at least one electrical module from the plurality of electrical modules is dependent upon at least another electrical module from the plurality of electrical modules, the first electrical module from the plurality of electrical modules including a first connector, a second connector and a circuit board, the first connector including the connector adapted to couple to a connector of another one of the electrical modules, the first connector fixedly coupled to the circuit board at a first end of the circuit board, the second connector fixedly coupled to the circuit board at a second end of the circuit board opposite the first end.

16. The system of claim 15, wherein the first electrical module from the plurality of electrical modules is a power module, the second electrical module from the plurality of electrical modules is an input module, and the third electrical module from the plurality of electrical modules is an output module.

17. The system of claim 16, wherein functionality of the input module and functionality of the output module are dependent upon a power provided by the power module, and the functionality of the output module is dependent upon an output of the input module.

18. The system of claim 15, wherein the first connector of the first electrical module has a first side surface and a first coupling member disposed on the first side surface, a first top surface orthogonal to the first side surface, and a first bottom surface orthogonal to the first side surface and parallel with the first top surface, the connector of the another one of the electrical modules having a second side surface and a second coupling member disposed on the second side surface, a second top surface orthogonal to the second side surface, and a second bottom surface orthogonal to the second side surface and parallel with the second top surface, when the first connector of the first electrical module is coupled to the connector of the another one of the electrical modules with the first coupling member engaging the second coupling member and the first bottom surface of the connector of the first electrical module and the second bottom surface of the connector of the another one of the electrical modules are contacting a common planar support surface, the first side surface of the connector of the first electrical module abuts and contacts the second side surface of the connector of the another one of the electrical modules, and the first top surface of the connector of the first electrical module and the second top surface of the connector of the another one of the electrical modules are disposed substantially aligned in a same plane.

19. The system of claim 15, wherein the at least three electrical conductors of each electrical module from the plurality of electrical modules includes an engagement portion configured to engage a different electrical conductor of another electrical module from the plurality of electrical modules.

20. The system of claim 15, wherein each electrical module from the plurality of electrical modules includes a circuit board, each connector of each electrical module includes a housing coupled to the circuit board, the at least three electrical conductors coupled to the housing and each includes a coupling portion adapted to engage and electrically communicate with the circuit board.

21. The system of claim 15, wherein each electrical module from the plurality of electrical modules includes a circuit board, each connector of each electrical module includes a housing coupled to the circuit board and a magnet coupled to the housing, a projection disposed outside a side surface of the housing, and a receptacle defined relative to the side surface of the housing, each projection configured to be received within a receptacle of another electrical module from the plurality of electrical modules, and each receptacle configured to receive a projection of the another electrical module from the plurality of electrical modules.

* * * * *